(12) United States Patent
Hirano

(10) Patent No.: US 6,735,125 B2
(45) Date of Patent: May 11, 2004

(54) NONVOLATILE SEMICONDUCTOR MEMORY DEVICE AND METHOD OF ERASING THE SAME

(75) Inventor: Yasuaki Hirano, Tenri (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/051,313

(22) Filed: Jan. 22, 2002

(65) Prior Publication Data

US 2002/0139999 A1 Oct. 3, 2002

(30) Foreign Application Priority Data

Jan. 22, 2001 (JP) ........................................ 2001-013029

(51) Int. Cl.⁷ ............................................. G11C 16/04
(52) U.S. Cl. ............................ 365/185.29; 365/185.18
(58) Field of Search ........................ 365/185.29, 185.18, 365/185.01

(56) References Cited

U.S. PATENT DOCUMENTS 5,274,599 A * 12/1993 Ema ...................... 365/185.22
5,617,359 A * 4/1997 Ninomiya .............. 365/185.29

FOREIGN PATENT DOCUMENTS

JP          8-111096       4/1996

* cited by examiner

*Primary Examiner*—Hoai Ho
(74) *Attorney, Agent, or Firm*—Morrison & Foerster LLP

(57) ABSTRACT

In a nonvolatile semiconductor memory device, a voltage Vpp of 12 V applied to an external terminal is dropped by a resistance element of 3500 Ω to a voltage Vrpin. Vrpin is inputted to a regulator circuit to output a stabilized voltage Vpll of 5 V, so that Vpll is applied to a common source line as an erase pulse voltage. Termination of a first erase pulse application is judged by a level detection circuit based on a result of comparison between a reference voltage Vref of 11 V and an input voltage Vrpin which begins with 5 V upon start of the erase operation. Thus, since a large voltage magnitude of the input voltage is secured, a variation in the threshold voltage of a memory cell after the termination of the first erase pulse application can be made small, thereby preventing degradation of the erase speed.

12 Claims, 18 Drawing Sheets

NONVOLATILE SEMICONDUCTOR MEMORY DEVICE AND METHOD OF ERASING THE SAME

BACKGROUND OF THE INVENTION

The present invention relates to a nonvolatile semiconductor memory device wherein a high voltage is applied to a source of the nonvolatile semiconductor memory device during erasure and a method of erasing the same.

ETOX (brand name of an Intel product, abbreviation of EPROM Thin Oxide) is one of conventional flash memories i.e. batch erase type memories that are most widely used. FIG. 8 shows a schematic cross sectional view of this ETOX-type flash memory cell. As shown in FIG. 8, a floating gate 5 is formed via a tunnel oxide film 4 on a source 1, a drain 2 and a well of substrate 3 between the source and the drain. A control gate 7 is further formed on the floating gate 5 via an interlayer insulating film 6.

The operation principles of the above ETOX-type flash memory are explained below. During a write operation, a voltage Vpp (for example, 10 V) is applied to the control gate 7, a standard voltage Vss (for example, 0 V) is applied to the source 1 and a voltage of 6 V is applied to the drain 2 as shown in Table 1. Consequently, a large amount of current flows in a channel layer. Channel hot electrons are generated in a portion on the drain 2 side having a high electric field, and then electrons are injected into the floating gate 5. As a result, the threshold voltage of the memory cell 8 is increased and data is written to the memory cell. FIG. 9 shows a threshold voltage distribution in a written i.e. programmed state and an erased state. As shown in FIG. 9, the threshold voltage of the written memory cell becomes 5 V or higher.

TABLE 1

|       | Control gate 7 | Drain 2 | Source 1 | Substrate 3 |
|-------|----------------|---------|----------|-------------|
| Write | 10 V           | 6 V/0 V | 0 V      | 0 V         |
| Erase | −9 V           | Open    | 5 V      | 0 V         |
| Read  | 5 V            | 1 V     | 0 V0     | 0 V         |

Furthermore, during an erase operation, a voltage Vnn (for example, −9 V) is applied to the control gate 7 and a voltage Vpe (for example, 5 V) is applied to the source 1 to open the drain 2 as shown in FIG. 10. Consequently, a strong electric field is generated in the tunnel oxide film 4 between the source 1 and the floating gate 5. Then, electrons are pulled to the source 1 side by Fowler-Nordheim (FN) tunneling to decrease the threshold voltage of the memory cell 8. As a result, the threshold voltage of the erased memory cell 8 becomes 1.5 to 3 V as shown in FIG. 9.

Furthermore, during a read operation, a voltage of 1 V is applied to the drain 2 while a voltage of 5 V is applied to the control gate 7. Here, when the memory cell 8 is in an erased state and therefore its threshold voltage is low, a current flows into the memory cell 8 and a state "1" is determined. On the other hand, when the memory cell 8 is in a written state and therefore its threshold voltage is high, a currents does not flow into the memory cell and a state "0" is determined.

Based on such operation principles, the write, erase and read operations are performed in the memory cell 8.

The method of erasing the flash memory is hereinafter referred to as a conventional erase method 1.

In an actual erase operation in a nonvolatile semiconductor memory device, batch erasure is performed in units of relatively large blocks, for example, 64 kB. In this case, since threshold voltages of memory cells in the block to be erased may be in a written state or an erased state, a complicated algorithm is used for the batch erasure. A basic algorithm of the conventional erase method 1 is shown in FIG. 11. This batch erasure algorithm is briefly explained below.

When an erase operation is started, a write-before-erase operation is first performed in all the memory cells to prevent overerasure in step S1. That is, pulses having a prescribed width as write-before-erase pulses are applied to the control gate 7 and the drain 2 of a memory cell 8. In step S2, a write-verify operation is performed. That is, the threshold voltage value of each memory cell 8 is verified. In step S3, whether the verify result is acceptable, that is, whether the threshold voltage values of all the memory cells are a prescribed value (5.0 V) or higher, the voltage for a written state, is judged. As a result, when the result is unacceptable, the operation goes back to the aforementioned step S1 and the write-before-erase operation is repeated. On the other hand, when the result is acceptable, the operation proceeds to step S4. Thus, until the threshold voltages of all the memory cells in a block to be erased become the prescribed value or higher, the write-before-erase pulse application and the verify operation are repeated.

In step S4, erase pulses are applied. In this erase pulse application, to prevent overerasure (excessive erasure, which means in the case of FIG. 9 that a threshold voltage value of a memory cell becomes 1.5 V or lower), the pulse width of the erase pulses is set to be shorter than time required for complete erasure (for example, 10 ms) and pulses are applied to the control gate 7 and the source 1 in a memory cell to be erased in units of word lines in a batch.

In step S5, an erase-verify operation is performed. That is, the threshold voltage value of each memory cell 8 is verified. In step S6, whether the verify result is acceptable, that is, whether the threshold voltage values of all the memory cells are a prescribed value (3.0 V) or lower representing an erased state, is judged. As a result, when the result is unacceptable, the operation goes back to the aforementioned step S4 and the erase pulses application is repeated. On the other hand, when the result is acceptable, the operation proceeds to step S7.

The erase-verify operation in the above step S5 is the same as the read operation in Table 1 except that a voltage of 3.0 V is applied to the control gate 7 via a word line. That is, a voltage of 3.0 V is applied to a word line of a selected memory cell to be verified while 0 V is applied to word lines of the other unselected memory cells. Then, a verify operation is performed by successively selecting a word line and detecting whether a cell current flows into a memory cell. Alternatively, a voltage of 5.0 V is applied to a word line and its current level is compared with that of a memory cell having a threshold voltage of 3.0 V. Then, if there is at least one memory cell having the prescribed threshold voltage or higher, erase pulses are applied again. Thus, until the threshold voltages of all the memory cells in the block to be erased become a desired value or lower, the erase pulse application and the verify operation are repeated.

In step S7, an overerase-verify operation is performed to verify existence an overerased memory cell. In step S8, whether the verify result is acceptable is judged. As a result, if at least one overerased memory cell is detected, the operation proceeds to step S9. If not, the erase operation is terminated. In step S9, a soft program (light-level write) is performed in theovererased memory cell. Thus, the threshold voltage of the overerased memory cell is increased. When it is determined in the aforementioned step S8 that the threshold voltage distributions of all the memory cells fall in the range of 1.5 to 3.0 V, the erase operation is terminated.

Usually, an erase characteristic of the memory cell 8 varies as shown in FIG. 12 and there are memory cells wherein the erase operation is fast performed (fast cells) and memory cells wherein the erase operation is slowly performed (slow cells). FIG. 12 shows that, when erase pulses are applied for 300 ms in total, the threshold voltage of the fast cell becomes 3 V which is the upper limit voltage of the erased state and that the threshold voltage of the slow cells becomes 1.5 V which is the lower limit voltage of the erased state.

However, the variation in the erase characteristic of the memory cell 8 is further increased, and the overerasure is progressed. In particular, if there is a memory cell of which threshold voltage is 0 V among unselected memory cells and there is a memory cell of which threshold voltage is 0 V or lower, a cell current flows into the memory cell even if 0 V is applied to the word lines of unselected memory cells during the erase-verify operation. Therefore, a correct verify operation cannot be performed for the selected memory cell and thus reliability of the flash memory is degraded.

Accordingly, to avoid this overerasure, in a series of erase operations, changes in the threshold voltage value need to be frequently checked (verified) while erase pulses having a short pulse width are being applied. Furthermore, the erase pulse application and the erase-verify operation need to be repeated.

In the conventional erase method 1, a positive high voltage (for example, 5 V) is applied to the source 1 while a negative voltage (for example, −9 V) is applied to the control gate 7 so that electrons are pulled from the floating gate 5. However, since depletion occurs in a region under the floating gate 5 due to a potential difference between the floating gate 5 and the source 1, a work current i.e. BTBT (Band To Band Tunneling) current is generated from the source 1 to the substrate 3 due to tunneling between bands. The larger the potential difference between the floating gate 5 and the source 1 becomes, the more remarkable this phenomenon becomes. That is, the larger the amount of electrons injected in the floating gate 5 and the higher the threshold value of the memory cell becomes, the more work current is generated. Since a leakage current is increased, the total current consumption is increased. Therefore, as shown in FIG. 13, the amount of an erase current is largest immediately after start of erase pulse application and as the erasure is progressed, the amount of the erase current is decreased.

In addition, in the conventional erase method 1, among these series of erase operations, the erase-verify operation needs to be performed only when the memory cells have threshold voltages decreased to some extent and are becoming an erased state. In a conventional batch erase algorithm shown in FIG. 11, wherein the erase pulse application and the erase-verify operation are repeated from the beginning, time spent for the erase-verify operation in an initial stage of an erase operation is wasted.

As one of methods for solving such a wasting problem, a method of erasing a flash EEPROM (Electrically Erasable Programmable Read-Only Memory) described in Japanese Patent Laid-Open Publication H08-111096 has been disclosed. Hereinafter, this method of erasing a flash EEPROM is referred to as a conventional erase method 2.

According to the conventional erase method 2, the erase operation is performed by utilizing the increase of the source line voltage shown in FIG. 14. FIG. 15 shows a circuit diagram of an erase operation system. This erase operation system circuit has a level detection circuit 12 for detecting the voltage of the common source line 11 and for sending a feedback to a first level shifter circuit HV1. Furthermore, the erase method in this case is a high voltage source erase method, wherein +12 V (Vpp) is applied to the source while 0 V is applied to the control gate and the drain is floated, and is different from a negative voltage control gate erase method which is the above-described conventional erase method 1.

The conventional erase method 2 is also of a source erase type, wherein electrons of the floating gate are pulled to the source. There is also a large leakage current from the source of the memory cells to the substrate in the initial stage of the erase operation as in the case of the conventional erase method 1 of erasing a the flash memory. Therefore, as shown in FIG. 14, the conventional erase method 2 has characteristics that the voltage of a source line for a memory cell being erased is greatly decreased and then increased by decreasing the threshold value of the memory cell as the erase operation proceeds, so that the amount of the leakage current from the memory cell is reduced.

FIG. 4 shows an erase algorithm in the conventional erase method 2. When the start of the erase operation, a write-before-erase operation is first performed in steps S11 to S13 in the same manner as in steps S1 to S3 in the erase algorithm of the conventional erase method 1 shown in FIG. 11. When the result of the write-verify operation is acceptable, the operation proceeds to step S14. In step S14, the first erase pulse application is started. In step S15, whether the source line voltage Vs is equal to a voltage Vref or higher is judged. As a result, when the voltage becomes equal to the voltage Vref or higher, the operation proceeds to step S16. In step S16, the first erase pulse application is terminated. The relationship between the source line voltage and the erase pulse application time in this case is the same as the one shown in FIG. 14. Furthermore, FIG. 16 shows the relationship between the source line voltage Vs and the threshold voltage Vth. As shown in FIG. 14, in the initial stage, a large amount of a leakage current flows and the source line voltage does not reach 12 V, the voltage to be applied during erasure. Then, the amount of the leakage current is reduced with time. The source line voltage is gradually increased and finally increased to a level close to 12 V. As described above, this is because the BTBT current is reduced as the threshold voltage Vth is decreased (see FIG. 16).

In the above conventional erase method 2, this relationship is utilized for an erase operation. That is, the first erase pulse application is continued until the source line voltage Vs is increased and reaches the voltage Vref (for example, 10 V). Then, when the source line voltage Vs becomes equal to the voltage Vref, an output of a level detection circuit 12 changes. The output of the level shifter circuit HV1 is set as "H" to turn off a P-MOS transistor 13 and the erase pulse application is stopped. Then, the operation is transited to a usual erase operation by a level shifter circuit HV2 based on an output from an erase pulse generation circuit 14.

In steps S17 to S22, application of erase pulses having a pulse width of about 10 ms and the erase-verify operation are repeated. When all the memory cells are checked and whether there is any overerased memory cell, whose threshold voltage is 3 V or lower, is determined. If there is any, a soft program is performed and the erase operation is terminated. These are in the same manner as in steps S4 to step S9 in the erase algorithm of the conventional erase method 1 shown in FIG. 11.

The conventional erase method 2 has a disadvantage that current consumed in the source section during the erase operation is larger as compared with the conventional erase method 1. In the high voltage source erase of the conventional erase method 2, 12 V is applied to the source, the amount of an erase current is about five times larger than that in the negative voltage control gate erase of the conventional erase method 1. For example, in the case of a 64-kB block erasure, the erase current is about 2 mA in the negative voltage control gate erase of the conventional erase method 1. On the other hand, it is about 10 mA in the high voltage source erase of the conventional erase method 2.

Therefore, it is desirable to apply the negative voltage control gate erase method to the conventional erase method 2. However, when the negative voltage control gate erase method is applied to the conventional erase method 2, the following problems arise.

FIG. 17 shows the relationship between the threshold voltage Vth and the source line voltage Vs with respect to an erase time when the negative voltage control gate erase method is applied to the conventional erase method 2. FIG. 18 shows the relationship between the source line voltage and the erase time when the negative voltage control gate erase method is applied to the conventional erase method 2. FIG. 19 is a circuit diagram for application of source voltage during an erase operation when the negative voltage control gate erase method is applied to the conventional erase method 2.

As described above, in the conventional erase method 1, an erase current including a leakage current is about ⅕ of that of conventional erase method 2. Therefore, a small amount of a BTBT current is generated in the memory cell section. Therefore, as shown in FIG. 18, the source line voltage Vs is increased desirably from its initial state to a level close to 5 V, a voltage to be applied. When the voltage Vref of a level detection circuit 15 in FIG. 19 is set at 4.5 V and the source line voltage Vs is increased to 4.5 V, an output signal of the level detection circuit 15 is inverted and the output level of a level shifter circuit 16 becomes "H". Then, the first erase pulse application is terminated.

However, since the level detection circuit 15 is configured by comparators as shown in FIG. 3, an offset voltage is present in an input stage until the source line voltage Vs reaches near 4.5 V and the output level is inverted. Since this offset voltage changes due to a process variation or a temperature variation, a variation of about 0.1 V may be generated. As shown in FIG. 17, since the voltage Vref is 4.5 V, only a small voltage magnitude VB from the source line voltage Vs is possible immediately after the start of the erase operation. Therefore, the variation of the offset voltage reaches about 1 V in maximum as a variation of the source line voltage Vs.

When the conventional erase method 2 is employed in the negative voltage control gate erase method, there is a small amount of the BTBT current. Therefore, since there is a small voltage difference due to the change in the source line voltage Vs and, furthermore, the applied voltage is as small as 5 V, the threshold voltage upon the termination of the first erase pulse application is greatly changed as shown in FIG. 17. Thus, a serious problem arises that a large variation occurs in the threshold voltage distribution.

As a result, when a variation in the threshold voltage after the first erase pulse application is shifted to a value higher than the voltage Vref, the number of times of the second and subsequent erase pulse applications and the erase-verify operations vary, resulting in a longer erase time. Furthermore, there is also a problem that, when the variation of the threshold voltage is shifted to a value lower than the voltage Vref, overerasure occurs in memory cells positioned on the lower threshold voltage distribution side. As one means for preventing the latter problem, a resistance element 17 can be inserted between the output of the level shifter circuit 16 and the input of the level detection circuit 15 as shown in FIG. 19. Consequently, when the change of the source line voltage Vs is increased, the variation in the threshold voltage upon the termination of the first erase pulse application is reduced. However, since the change in the source current is limited when this method is employed, the change in the source line voltage Vs with time becomes as shown in FIG. 20. Therefore, as compared with the case where the resistance element 17 is inserted (see FIG. 18), the rise of the source line voltage Vs immediately after the start of the erase pulse application is small and slowly increased afterwards. Therefore, as a result, the erase speed is degraded and the erase time becomes longer.

SUMMARY OF THE INVENTION

Accordingly, an object of the present invention is to provide a nonvolatile semiconductor memory device wherein a time of a first erase pulse application can be set without degrading an erase speed so that a variation of a threshold voltage can be made small, and a method of erasing the same.

To achieve the above object, a nonvolatile semiconductor memory device, comprising:

floating gate field effect transistors each having a control gate, a floating gate, a drain and a source and capable of electrically writing and erasing data, the floating gate field effect transistors being arrayed in a matrix on a substrate or a well;

a plurality of row lines connected to control gates of the floating gate field effect transistors arrayed in a row direction;

a plurality of column lines connected to drains of the floating gate field effect transistors arrayed in a column direction;

a common source line connected to sources of the floating gate field effect transistors constituting a block;

a regulator circuit for supplying a voltage applied to the common source line at least during erasure;

a resistance element inserted between the regulator circuit and an external power source;

voltage level detecting means for instructing start of the erase voltage application to the common source line, detecting that an input voltage from the resistance element to the regulator circuit reaches a prescribed voltage level and instructing termination of the erase voltage application to the common source line; and erase voltage applying means for receiving an instruction from the voltage level detecting means and applying an erase voltage from the regulator circuit to the common source line.

According to the present invention, since the threshold voltage of a floating gate field effect transistor in a written state is high immediately after the start of the erase operation, a large amount of leakage current including the BTBT current flows and there is a great voltage drop due to a resistance element inserted between an external power source and a regulator circuit. However, when an erase voltage continues to be applied to the common source line by erase voltage applying means, the threshold voltage of the floating gate field effect transistor is decreased. Along with this decrease, the leakage current is reduced and the voltage drop due to the resistance element is also reduced. Thus, the input voltage to the regulator circuit is increased. Eventually, when the voltage level detecting means detects that the prescribed voltage level is reached, the erase voltage applying means is instructed to terminate the erase voltage application to the common source line.

Therefore, reduction of the leakage current including the BTBT current with the decrease of the threshold voltage of a floating gate field effect transistor with the lapse of the erase time can be extracted as a change in the voltage drop by the resistance element inserted between the external power source and the regulator circuit.

Therefore, when the voltage of the external power source and the resistance value of the resistance element are appropriately selected, a large voltage magnitude of the input voltage from the resistance element to the regulator circuit, which is the voltage detected by the voltage level detecting means, can be secured. An influence of the variation on the output stage in the voltage level detecting means attributable to a temperature variation, a process variation or the like can be made small. Thus, the variation in the threshold voltage of the floating gate field effect transistor upon the termination of the erase voltage application can be made small.

That is, according to the present invention, when the erase pulse applications and the erase-verify operations are subsequently repeated, an overerased memory cell in an state attributable to the variation in the threshold voltage to a lower value and a longer erase time attributable to the variation in the threshold voltage to a higher value can be prevented. Therefore, as a result, the erase time can be shortened and excess discharge generated upon the erase pulse application and the erase-verify operation does not need to be repeated. Thus, a lower current consumption can be achieved.

In one embodiment of the present invention, the nonvolatile semiconductor memory device further comprises:
 a voltage boosting circuit provided between the external power source and the resistance element, wherein
 an output voltage from the voltage boosting circuit is supplied to the regulator circuit via the resistance element.

According to this embodiment, a voltage from the external power source is increased to a desired voltage by a voltage boosting circuit and then supplied to the regulator circuit via the resistance element. Thus, a nonvolatile semiconductor memory device wherein the current consumption can be reduced without degrading the erase speed is constructed by utilizing the voltage boosting circuit for internally generating voltages to write, erase and read data from a single power source, which is conventionally used in a flash memory or the like.

In one embodiment of the present invention, the prescribed voltage level detected by the voltage level detecting means is a voltage higher than the erase voltage applied to the common source line.

According to this embodiment, with a lapse of the erase time, the threshold voltage of the floating gate field effect transistor is decreased and the leakage current is reduced. When the input voltage to the regulator circuit is increased from the erase voltage along with this decrease, the termination of the erase voltage application is precisely determined based on the input voltage.

In one embodiment of the present invention, a resistance value of the resistance element is set at {a voltage of the external power source—the erase voltage}/{a maximum value of erase current}.

According to this embodiment, the input voltage to the regulator circuit can be reliably set to be the erase voltage even when the erase current is at the maximum value.

In one embodiment of the present invention, the resistance value of the resistance element is set at {the output voltage of the voltage boosting circuit during erasure—the erase voltage}/{a maximum value of erase current}.

According to this embodiment, the input voltage to the regulator circuit is secured as the erase voltage even if the erase current is at the maximum value.

In one embodiment of the present invention, an output voltage of the external power source during erasure is a voltage higher than the erase voltage.

According to this embodiment, the threshold voltage of the floating gate field effect transistor is decreased with the lapse of the erase time. When the leakage current is reduced along with this decrease, the input voltage to the regulator circuit can be increased from the erase voltage. Therefore, the termination of the erase voltage application can be precisely and stably determined.

In one embodiment of the present invention, the voltage of the external power source during erasure is 9 V or higher.

According to this embodiment, when the erase voltage applied to the common source line is, for example, 5 V, the voltage magnitude, which is the increased amount of the input voltage to the regulator circuit, can be made sufficiently large at 4 V.

The present invention also provides a method of erasing a nonvolatile semiconductor memory device in which floating gate field effect transistors each having a control gate, floating gate, drain and source and capable of electrically writing and erasing data are arrayed in a matrix on a substrate or a well, a plurality of row lines connected to control gates floating gate field effect transistors arrayed in a row direction and a plurality of column lines connected to drains of floating gate field effect transistors arrayed in a column direction are included and sources of the floating gate field effect transistors constituting a block are connected to a common source line, the method comprising:
 a first erase operation for continuing to apply an erase voltage to the common source line; and
 a second erase operation for repeating erase pulse application to the common source line and an erase-verify operation alternately,
 wherein a current value flowing between a stabilization circuit for generating a voltage applied to the common source line and a power source of this stabilization circuit is detected during the first operation and when the current value reaches a prescribed current value, the first erase operation is stopped and the second erase operation is started.

According to the above invention, the threshold voltage of the floating gate field effect transistor in the written state is high immediately after the start of the erase operation in the first erase operation. Therefore, a large amount of leakage current including the BTBT current flows and the current value from the power source to a stabilization circuit is also large. However, when the erase voltage continues to be applied to the common source line, the threshold voltage of the floating gate field effect transistor is decreased. Along with this decrease, the leakage current is reduced and the current value from the power source to the stabilization circuit is also reduced. Thus, when the current value from the power source to the stabilization circuit is reduced and the prescribed voltage value is reached, the first erase operation is stopped and the second erase operation is started.

Reduction of the leakage current including the BTBT current along with the decrease of the threshold voltage of the floating gate field effect transistor with the lapse of the erase time can be extracted as a change in the current value from the power source to the stabilization circuit.

Therefore, even when there is a temperature variation, a process variation or the like, the variation in the threshold voltage of the floating gate field effect transistor upon the termination of the erase voltage application can be made small. That is, according to the present invention, during the subsequently performed repetition of the erase pulse application and the erase-verify operation, an overerased memory cell attributable to the variation in threshold voltage to a lower value or a longer erase time attributable to the variation in the threshold voltage to a higher value can be prevented.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

Hereafter, embodiments of the present invention are explained in more detail with reference to the accompanying drawings.

Figure 1:
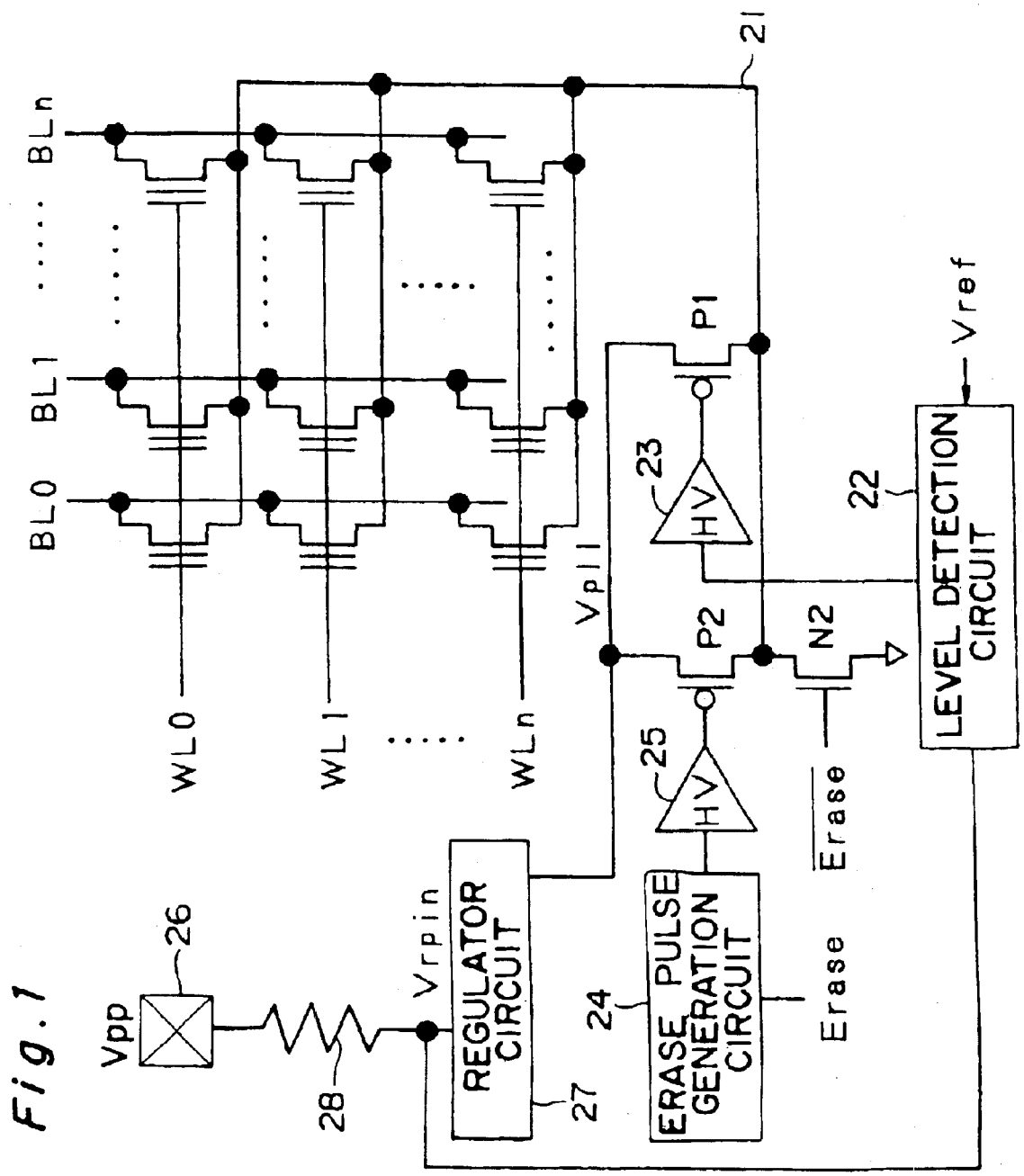
FIG. 1 is a block diagram showing a source voltage application circuit during erasure in a nonvolatile semiconductor memory device according to the present invention.

FIG. 1 is a block diagram of a source voltage application circuit during erasure in a nonvolatile semiconductor memory device according to a first embodiment. In the source voltage application circuit, a voltage is applied to a source line during an erase operation. The erase operation in this embodiment is basically the same as the one in the conventional erase method 2. That is, the first erase pulse application operation and the second and subsequent erase pulse application operations are separately performed. An erase voltage application circuit for applying voltages to word lines WL0 to WLn (commonly connected to control gates of memory cells arrayed in a row direction) and bit lines BL0 to BLm (connected to drains of memory cells arrayed in a column direction) in an erase operation (including a verify operation) is the same as a conventional one. Therefore, an explanation of the erase voltage application circuit is omitted.

Sources of memory cells constituting an array are connected in common on a block basis and connected to a common source line 21. Furthermore, the common source line 21 is connected to the source voltage application circuit during erasure wherein erase pulses are applied.

This source voltage application circuit during erasure is configured by a first circuit section and a second circuit section.

The first circuit section is a circuit wherein the aforementioned first erase pulse application operation is performed and configured by a level detection circuit 22, a level shifter circuit 23 and a P-MOS transistor P1.

The level detection circuit 22 monitors a change in an erase current through the common source line 21 as a change in a voltage level and compares it with a reference voltage (voltage Vref). Then, based on the comparison result, when the monitored voltage becomes equal to a voltage Vref, the output signal level is set as "H". The level shifter circuit 23 converts the output signal level of the level detection circuit 22. The P-MOS transistor P1 controls an on/off state of the first erase pulse application to the common source line 21 when the output signal of the level shifter circuit 23 is input to a gate of the P-MOS transistor P1. Thus, the first erase pulse application to the common source line 21 is switched off when the monitor voltage becomes the voltage Vref.

On the other hand, the second circuit section is an erase pulse application circuit for performing a conventional erase operation, wherein the second and subsequent erase pulse applications and the erase-verify operations are alternately performed. This circuit section is configured by an erase pulse generation circuit 24, level shifter circuit 25, a P-MOS transistor P2 and a N-MOS transistor N2.

The erase pulse generation circuit 24 generates an erase pulse signal at a level "L" when the start of the erase operation and the erase signal level becomes "H". The level shifter circuit 25 converts the level of the erase pulse signal from the erase pulse generation circuit 24. The P-MOS transistor P2 is turned on when the output signal of the level shifter circuit 25 is input to the gate of the P-MOS transistor P2. On the other hand, the N-MOS transistor N2 is turned off when an inversion signal of the erase signal is input to the gate of the N-MOS transistor N2. As a result, the second and subsequent erase pulses are applied to the common source line 21. Thus, when erase pulses are applied for a prescribed time (pulse width is, for example, 10 ms), the operation is transited to an erase-verify period and levels of the erase signal and its inversion signal are inverted. As a result, the P-MOS transistor P2 is turned off, while the N-MOS transistor N2 is turned on. Then, a reference voltage (0 V in this case) is applied to the common source line 21. Meanwhile, an erase-verify operation is performed by an erase-verify circuit (not shown).

The erase-verify circuit is not described here in detail. In short, the erase-verify circuit applies 3 V to a selected word line WL for performing the erase-verify operation, applies 0 V to an unselected word line WL for performing no erase-verify operation, and applies 1 V to bit lines BL. This circuit has a function of performing an erase-verify operation by verifying whether there is a memory cell in which a cell current flows.

The above configuration is the same as that of the conventional erase method 2 except that the erase pulse voltage level is different. Hereafter, a method of monitoring a voltage by using the level detection circuit 22, which characterizes this embodiment, is explained.

A voltage Vpp (for example, 12 V) inputted from an external power source 26 is applied to a regulator circuit 27 via a resistance element 28. At this time, a voltage drop is caused by the resistance element 28 and a voltage Vrpin is inputted to the regulator circuit 27. A voltage Vpll (for example, 5 V) that is made constant and stabilized is inputted to the source side of the P-MOS transistor P1 and the P-MOS transistor P2.

The resistance value of the resistance element 28 inserted between the external power source 26 and the input terminal of the regulator circuit 27 is set as follows. As described above, an erase current including the BTBT current, which is a leakage current of the flash memory, changes with time. The maximum value (initial state in the first erase pulse application) is set at 2 mA. In this case, to obtain a voltage Vpll of 5 V stabilized by the regulator circuit 27 even though the erase current has the maximum value, the resistance value R of the resistance element 28 can be {12 V–5 V}/2 mA=3500 Ω. Consequently, the erase current is reduced with time and the voltage drop by the resistance element 28 is reduced. As a result, even when the input voltage Vrpin to the regulator circuit 27 is increased, the voltage Vpll of 5 V is output by the regulator circuit 27 in a stable manner. Therefore, the voltage Vpll can be constantly maintained at 5 V in a stable manner.

Figure 2:
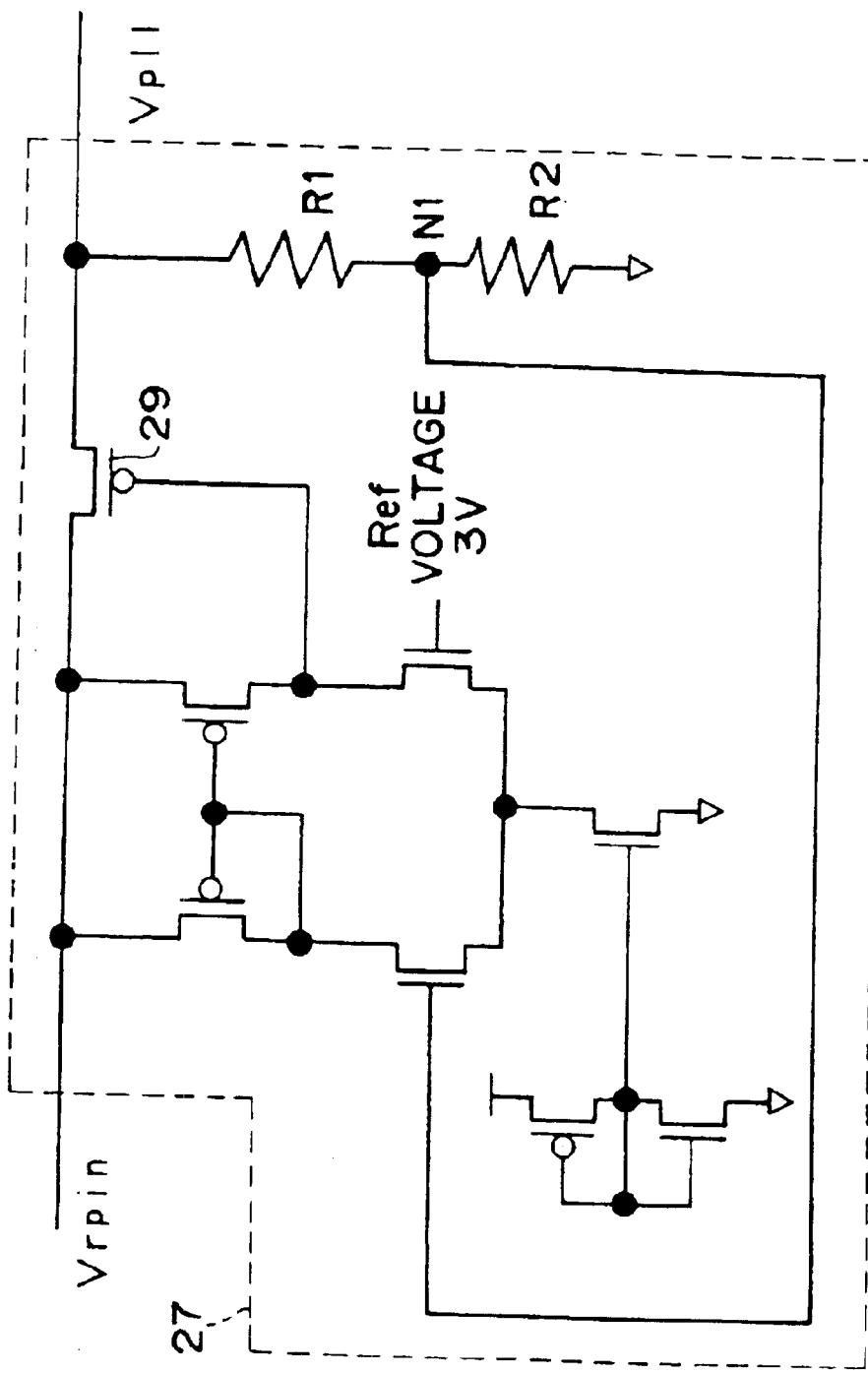
FIG. 2 shows a specific configuration example of a regulator circuit shown in FIG. 1.

FIG. 2 shows a specific configuration example of the regulator circuit 27. This regulator circuit 27 uses, for example, 3 V as a reference voltage (Ref voltage). When the output voltage Vpll is 5 V and the P-MOS transistor 29 is on, resistance values of resistances R1 and R2 are set so that the voltage of a node N1 between the resistances R1 and R2 connected in series should be 3 V. Furthermore, the P-MOS transistor 29 is turned off when the voltage of the node N1 becomes 3 V or higher. On the other hand, when the voltage of the node N1 becomes 3 V or lower, the P-MOS transistor 29 is turned on. Therefore, the voltage Vpll of 5 V is stably output without being affected by the input voltage Vrpin. Since this regulator circuit 27 is a known circuit, a detailed explanation thereof is omitted.

Figure 3:
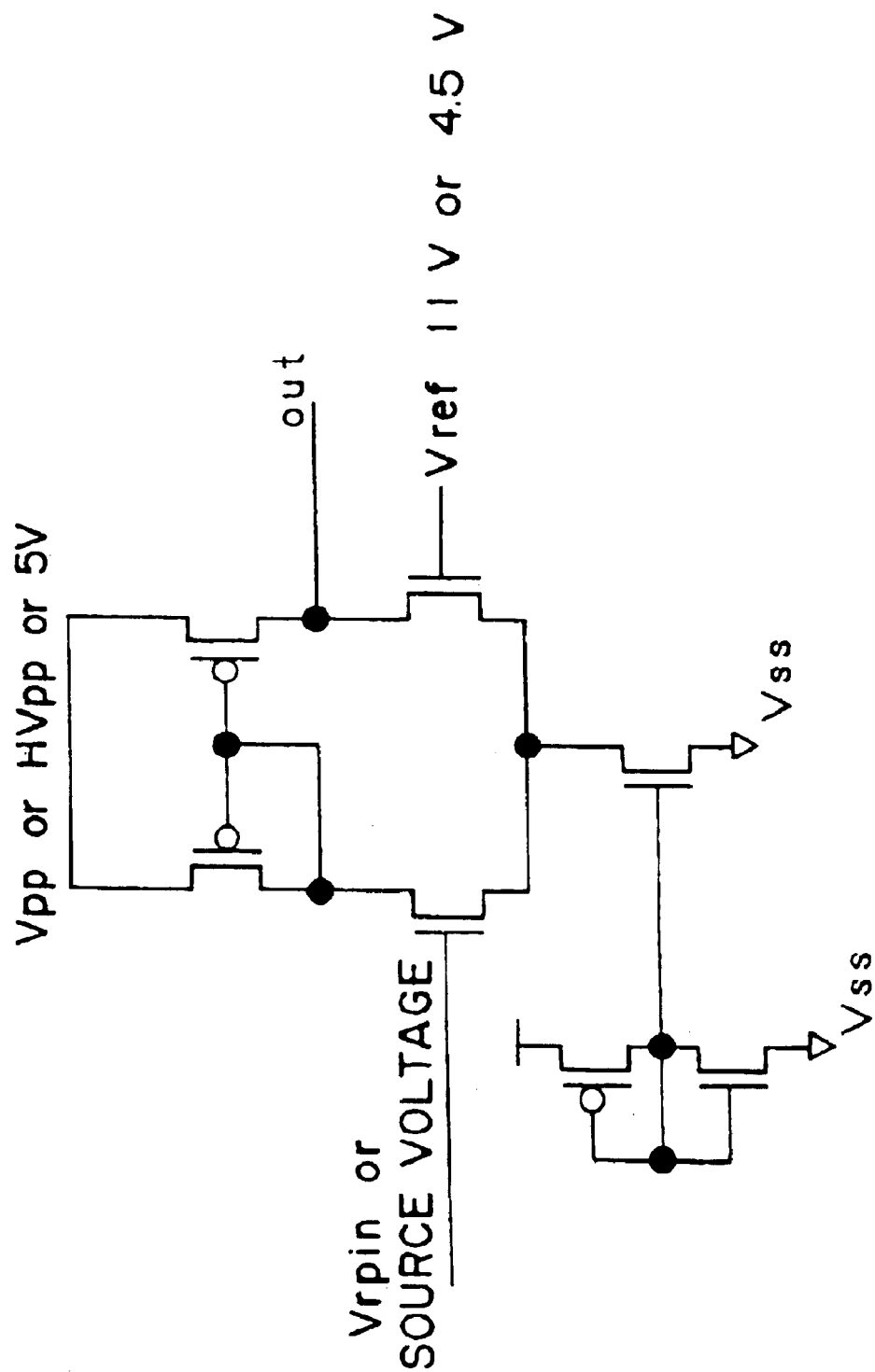
FIG. 3 shows a specific configuration example of a level detection circuit shown in FIG. 1.

The level detection circuit 22 has a circuit configuration shown in FIG. 3 explained in the conventional erase method 2. However, this circuit is different from that of the conventional erase method 2 in that the power source voltage is changed from 5 V to Vpp and that reference voltage Vref is changed from 4.5 V to, for example, 11 V as described later.

Figure 4:
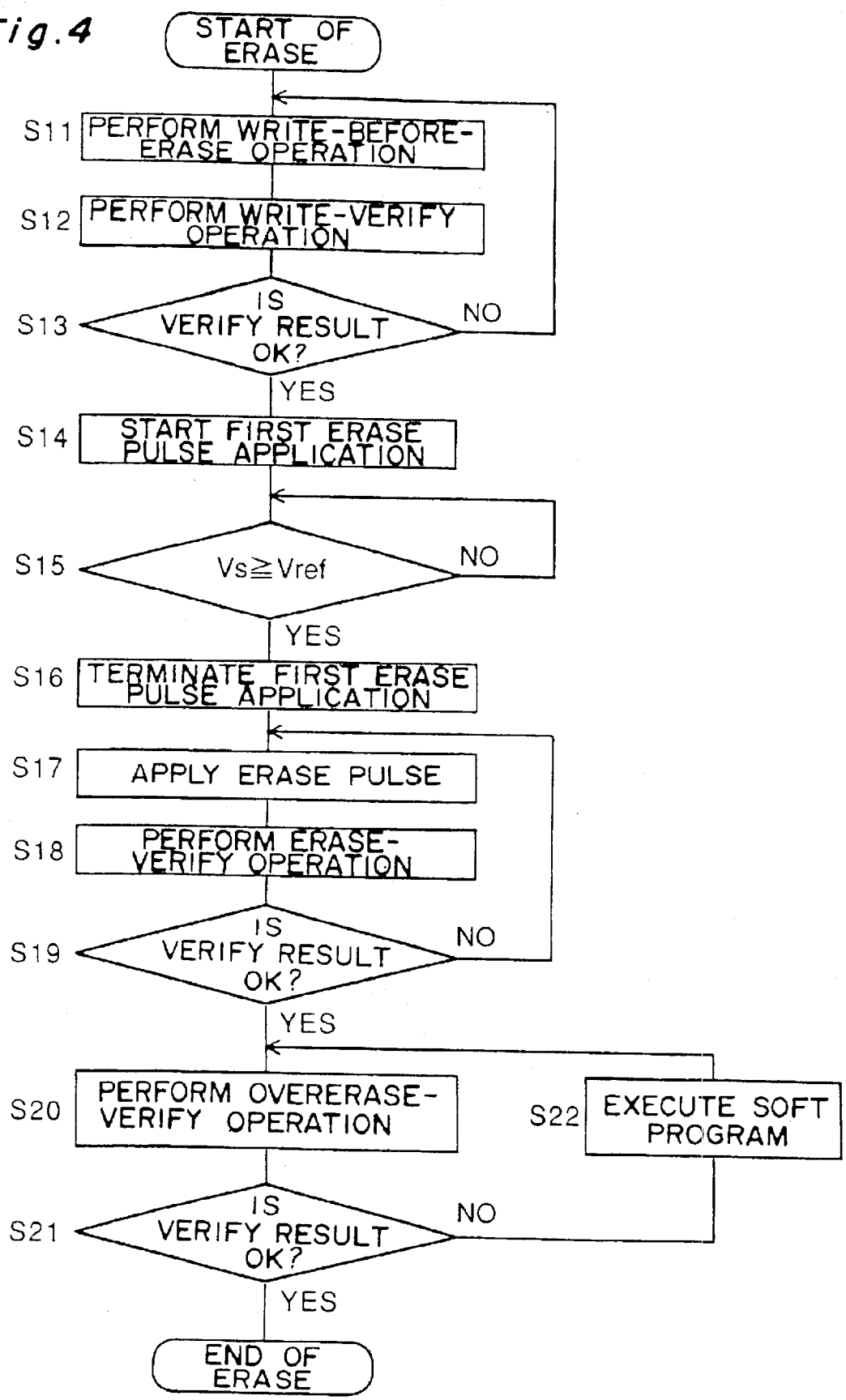
FIG. 4 shows an algorithm of the erase operation by the source voltage application circuit during erasure shown in FIG. 1.

The algorithm of the erase operation in this embodiment is the same as the one shown in FIG. 4. Hereafter, this algorithm is briefly explained. If erase pulses are applied while memory cells in a written state and memory cells in an erased state are both existent, memory cells may be over-erased. Therefore, when the start of the erase operation, first, threshold voltages of memory cells are verified by a write-verify operation while a write-before-erase operation is performed to increase the threshold voltages of the memory cells. Then, when all the threshold voltage memory cells to be erased becomes 5.0 V or higher, the write-before-erase operation is terminated.

Subsequently, the first erase pulse application is performed as follows. First, a voltage Vpp (=12 V) is inputted from the external power source 26 to output a voltage Vpll of 5 V from the regulator circuit 27. At this time, since the threshold voltage of the memory cell is high immediately after the erase pulse application as described above, there is a large BTBT current as a leakage current and thus there is a large erase current including the BTBT current. Therefore, the voltage drop caused by the resistance element 28 is large. When the resistance value is set at 3500 Ω, the input voltage Vrpin to the regulator circuit 27 is started at about 5 V.

In this case, since the output level of the level detection circuit 22 (the reference voltage Vref is set at 11 V in FIG. 3) becomes "L" (Vss), the level shifter circuit 23 outputs the voltage Vss level. As a result, the P-MOS transistor P1 is turned on and the voltage Vpll (5 V) is applied to the common source line 21.

Figure 18:
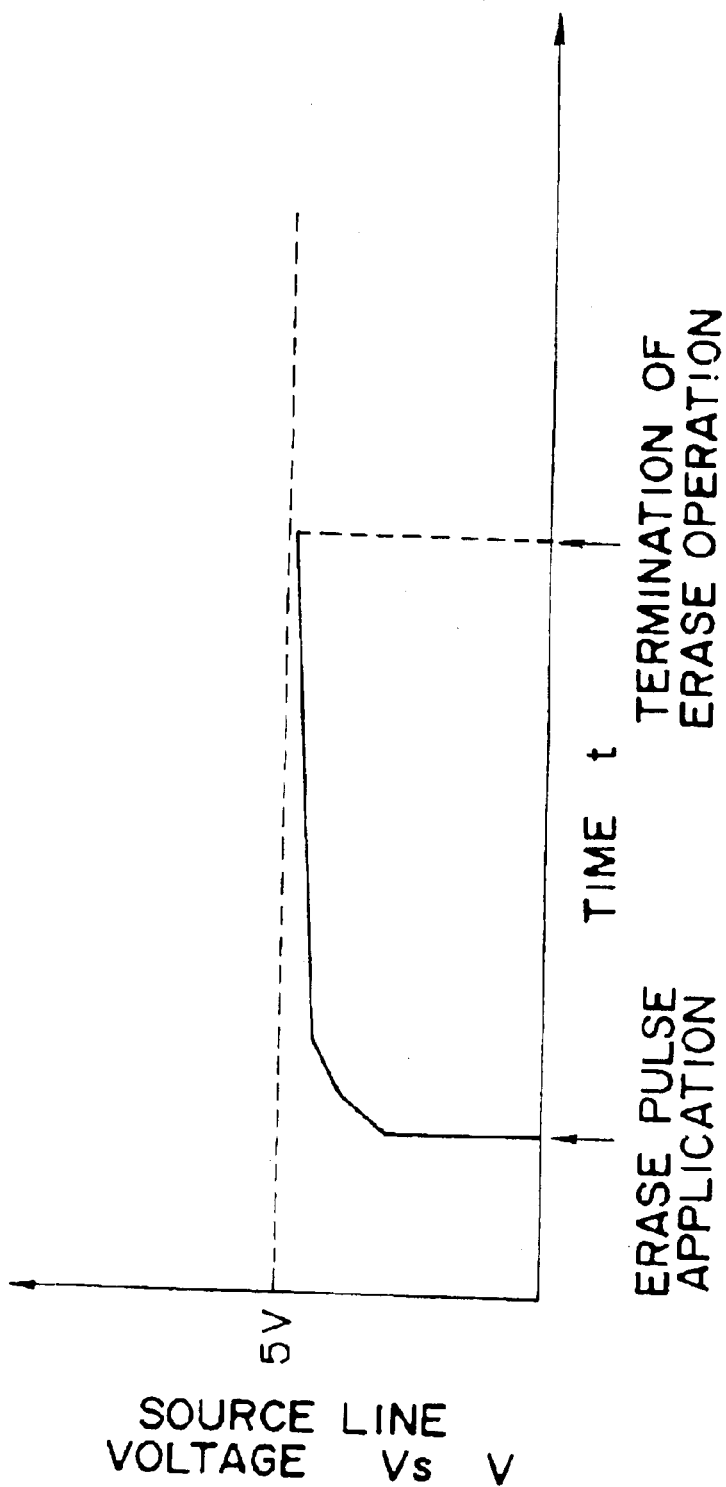
FIG. 18 shows the relationship between the source line voltage and the erase time when the negative voltage control gate erase method is applied to the conventional erase method 2.

Thus, when the erase pulses continue to be applied, the threshold voltage of the memory cell is decreased. Along with this decrease, the leakage current (BTBT current) is reduced and the source line voltage is increased as shown in FIG. 18. On the other hand, since the leakage current is reduced, the erase current (maximum value: 2 mA) including the leakage current is also reduced and the input voltage Vrpin to the regulator circuit 27 is increased. As described above, the voltage Vpll is stabilized at 5 V by the regulator circuit 27.

Figure 5:
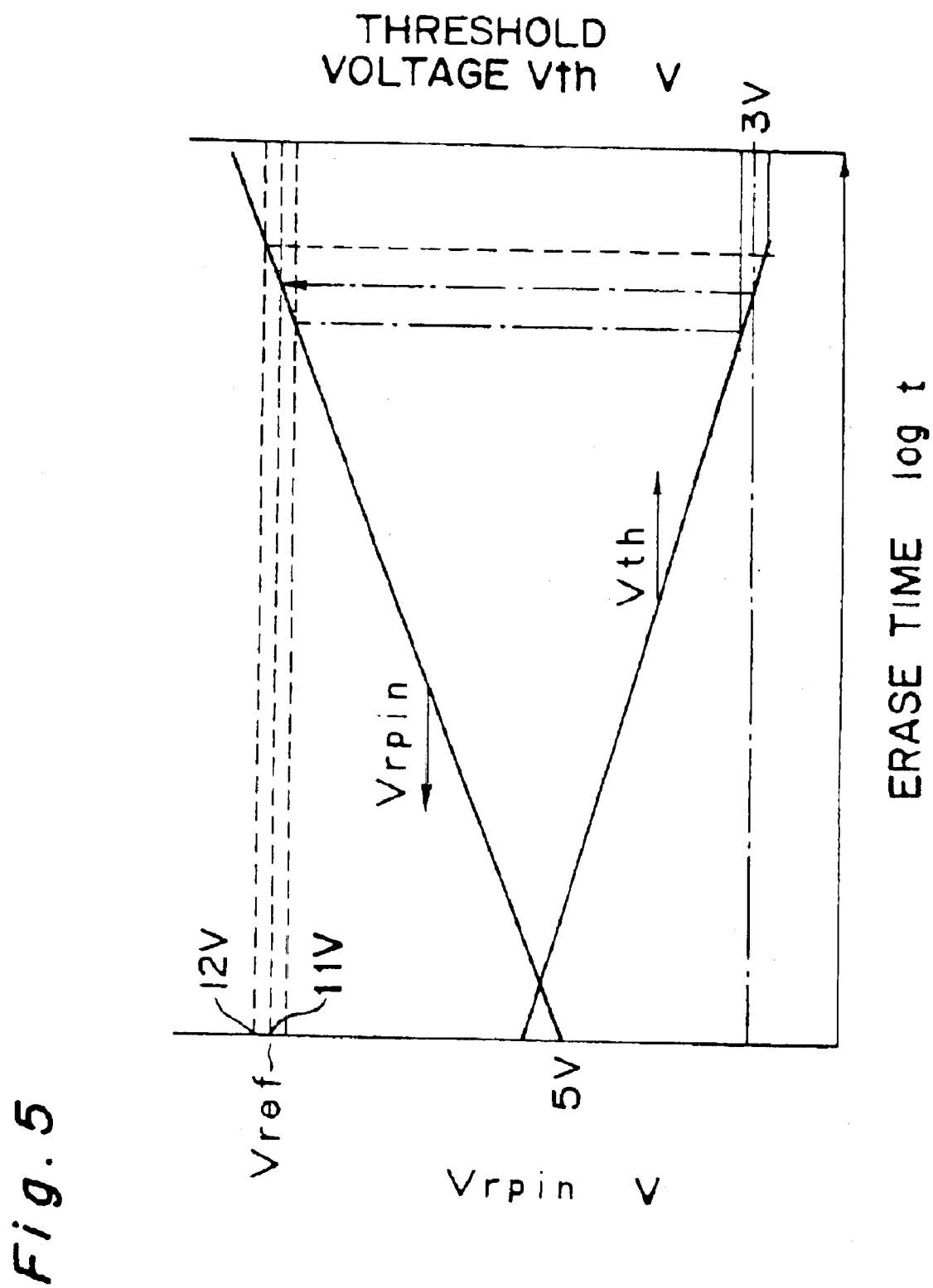
FIG. 5 shows changes in both an input voltage to the regulator circuit and in a threshold voltage of a memory cell with respect to an erase time, both the regulator circuit and the memory cell being shown in FIG. 1.

FIG. 5 shows changes of the input voltage Vrpin to the regulator circuit 27 and the threshold voltage Vth of the memory cell with respect to the erase time. As described above, with the erase time, the leakage current is reduced and therefore the erase current is reduced. Consequently, when the voltage Vrpin is increased and exceeds the reference voltage Vref (=11 V) of the level detection circuit 22, the output out of the level detection circuit 22 is inverted and its level becomes "H" (for example, Vpp). This signal is converted by the level shifter circuit 23 to turn off the P-MOS transistor P1 and the first erase pulse application is terminated.

Subsequently, the operation is transited to the erase pulse application operation along with the erase-verify operation in step S17 and the subsequent steps in FIG. 4. In this operation, as described above, the erase signal level is set as "H" and the P-MOS transistor P2 is turned on to apply the voltage Vpll (5 V) to the common source line 21. Then, the erase signal level during a verify operation is set as "L" and the N-MOS transistor N2 is turned on to apply the reference voltage (0 V) to the common source line 21.

During the above erase operation, since the level detection circuit 22 has a power source of Vpp (12 V) and the reference voltage Vref of 11 V, as shown in FIG. 5, the input voltage Vrpin starts at 5 V and a voltage magnitude of about 6 V or larger can be secured. Therefore, even when there is a variation in the offset voltage at an input stage attributable to a process variation or a temperature variation in the level detection circuit 22, an influence of the variation on the output stage can be made small. Therefore, a variation in the threshold voltage of the memory cell after termination of the first erase pulse application can be reduced to a range of about ±0.2 V, that is, about 0.4 V.

Consequently, even when this embodiment is applied to a nonvolatile semiconductor memory such as a flash memory or the like that generally employs the negative voltage control gate erase method, there is no possibility that there is an overerased memory cell attributable to the variation of the threshold voltage of the memory cell during the first erase pulse application to a lower value. Thus, a nonvolatile semiconductor memory with high reliability and a method of erasing the same can be achieved.

Furthermore, the number of times of the erase-verify operations and the erase pulse applications attributable to the variation in the threshold voltage of the memory cell to a higher value can be reduced. Thus, a longer erase time can be prevented.

Figure 19:
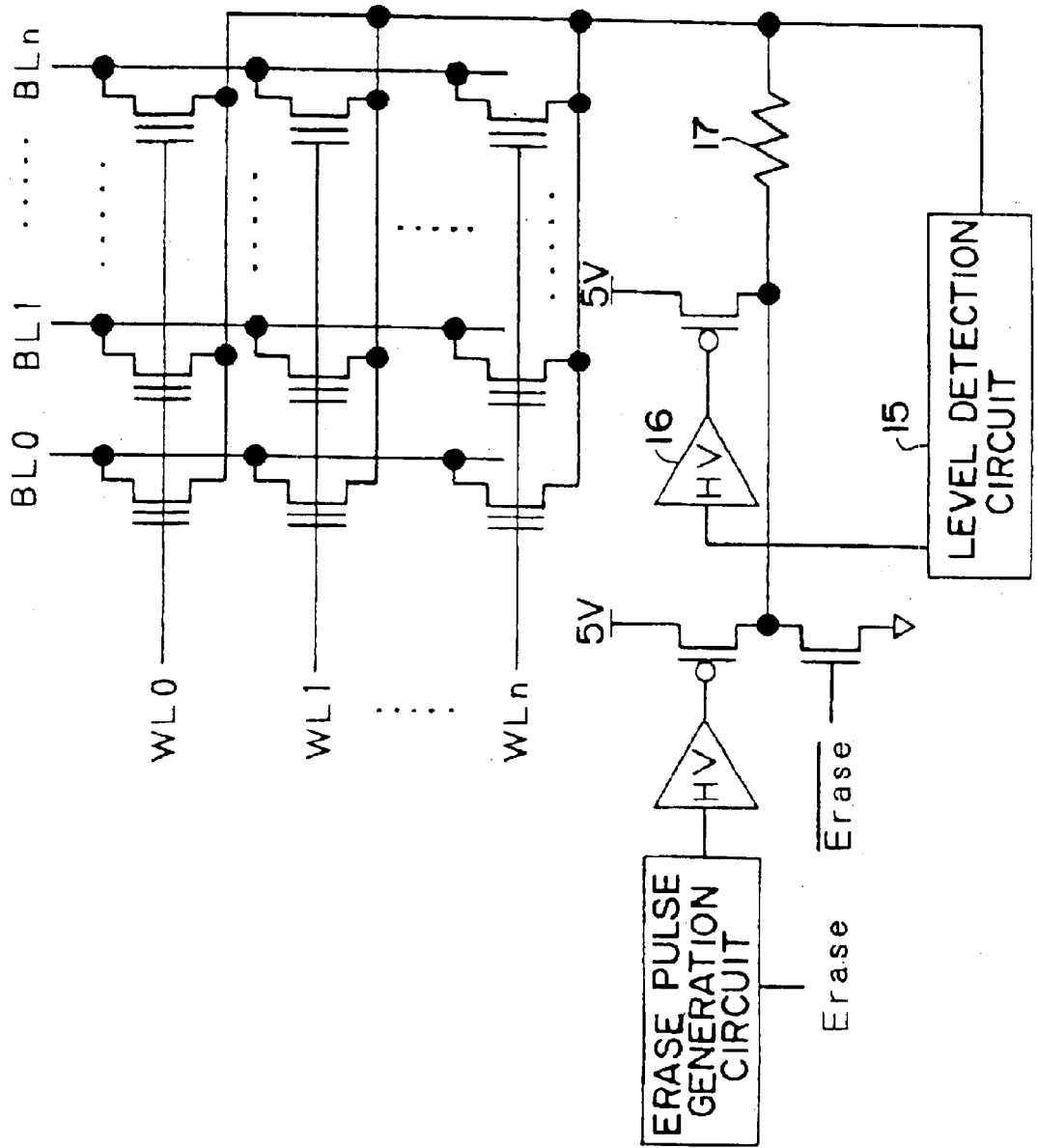
FIG. 19 is a block diagram of a circuit for application of source voltage during an erase operation when the negative voltage control gate erase method is applied to the conventional erase method 2.
Figure 20:
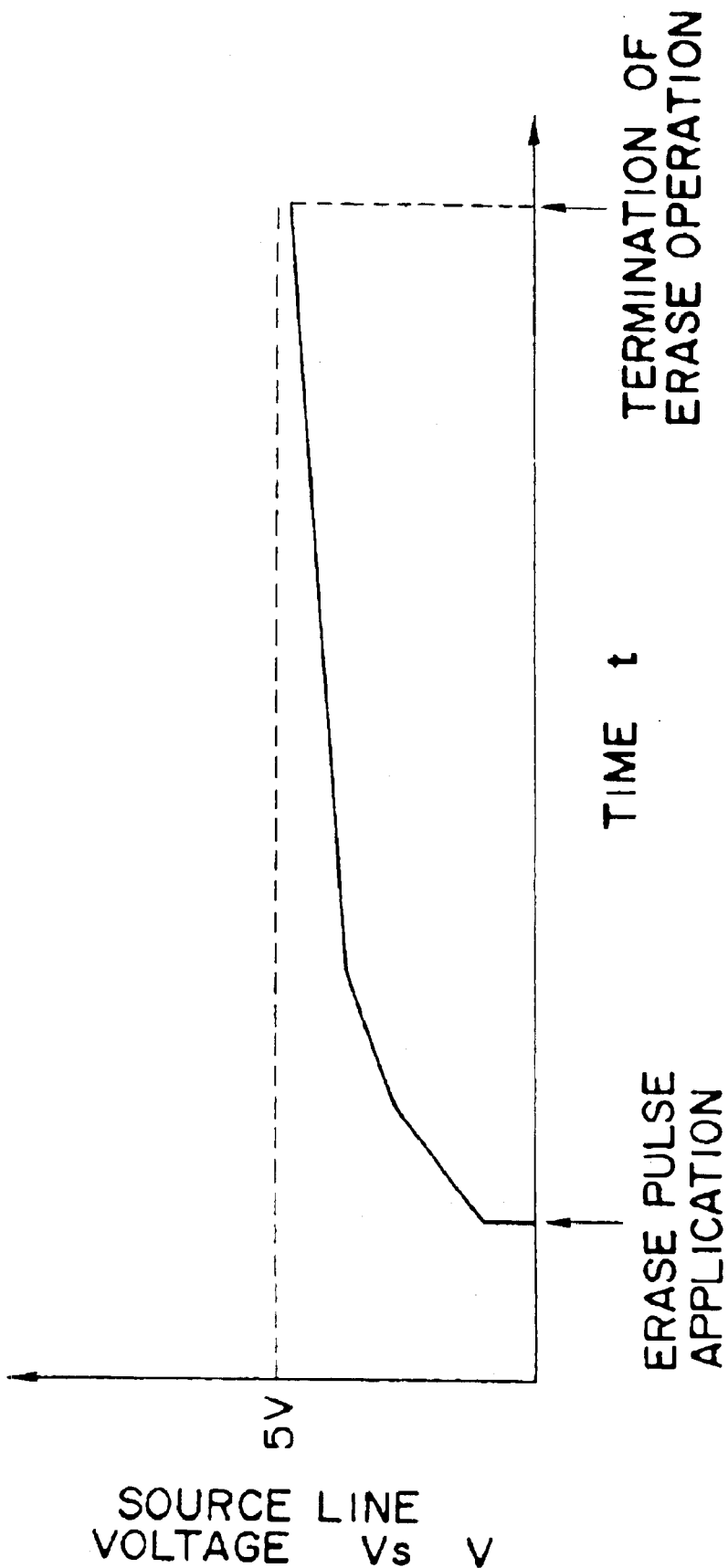
FIG. 20 shows the relationship between the source line voltage and the erase time when a resistance element is inserted between an output of a level shifter circuit and an input of a level detection circuit shown in FIG. 19.

Furthermore, since a resistance element 17 as overerasure preventing means shown in FIG. 19 does not need to be inserted, the erase time can be shortened about 30% as compared with the erase time in the case where the overerasure preventing means shown in FIG. 19 is used.

As described above, in this embodiment, the voltage value of the erase pulse applied to the common source line 21 is set at a voltage Vpll stabilized to 5 V by supplying a voltage Vrpin to the regulator circuit 27, the voltage Vrpin being obtained by dropping a voltage Vpp (12 V) of the external power source 26 with the resistance element 28 of 3500 Ω. Then, the level detection circuit 22 judges the termination of the first erase pulse application based on a comparison result between the reference voltage Vref of 11 V and the input voltage Vrpin to the regulator circuit 27 which has a voltage magnitude of about 6 V or larger after starting at 5 V at the start of the erase operation.

Therefore, an influence of the variation on the output stage in the level detection circuit 22 can be made small and the variation in the threshold voltage of the memory cell after termination of the first erase pulse application can be made small. That is, when the erase method of this embodiment is applied to a nonvolatile semiconductor memory such as a flash memory, a possibility of an overerased memory cell attributable to a variation to a lower value of the threshold voltage of the memory cell during the first erase pulse application can be eliminated. Meanwhile, the number of times of the second and subsequent erase-verify operations and the erase pulse applications attributable to the variation in the threshold voltage of the memory cell to a higher value can be reduced. Thus, a longer erase time can be prevented.

That is, according to this embodiment, a nonvolatile semiconductor memory device wherein the first erase pulse application can be performed without degrading the erase speed so that the variation in the threshold voltage is made small and a method of erasing the same can be achieved.

Figure 6:
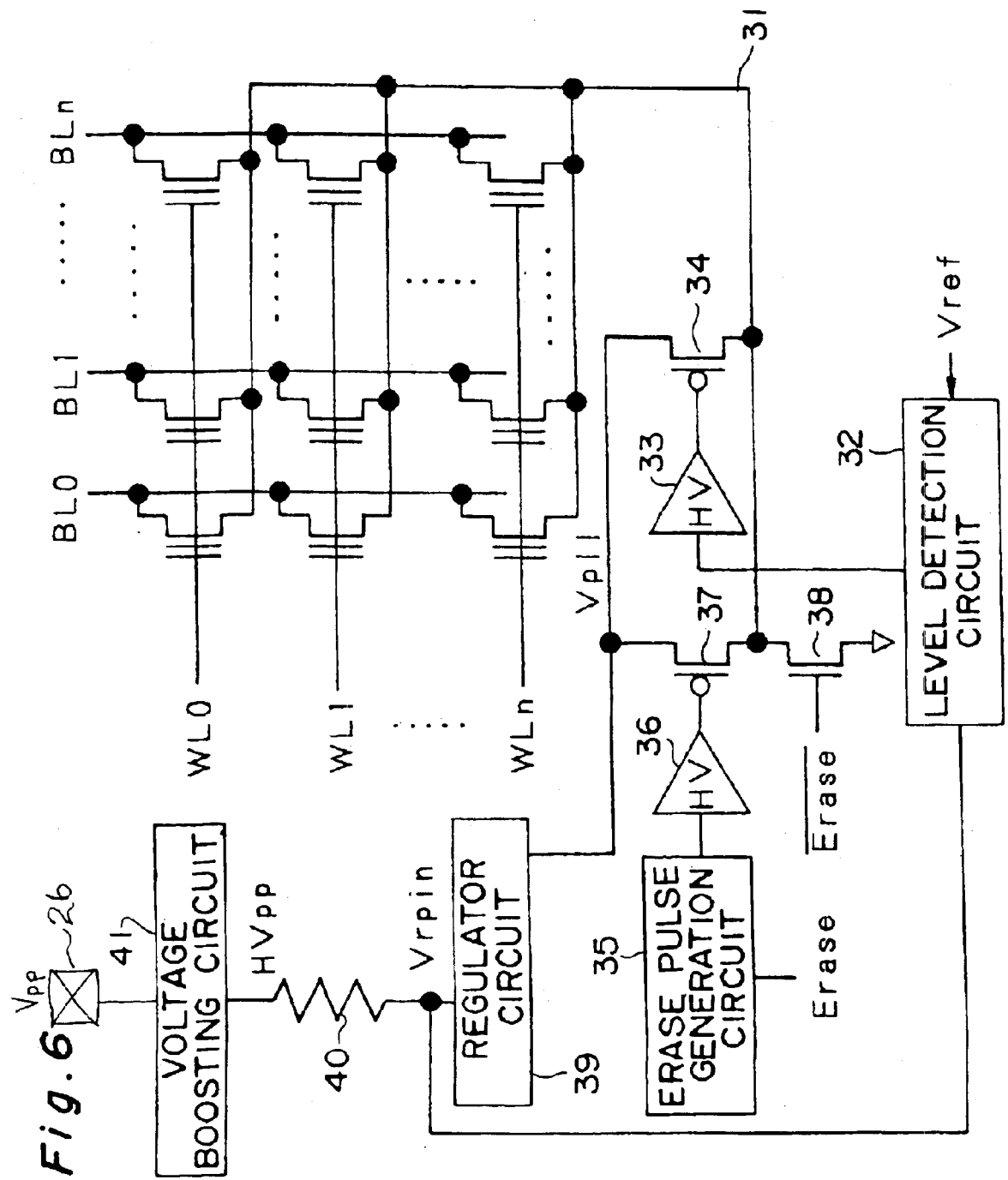
FIG. 6 is a block diagram showing a source voltage application circuit during erasure, which is different from the one shown in FIG. 1.

A second embodiment is explained with reference to a block diagram of a source voltage application circuit during erasure shown in FIG. 6. Some components of the second embodiment are the same as those of the first embodiment. Specifically, a common source line 31, level detection circuit 32, level shifter circuit 33, P-MOS transistor 34, erase pulse generation circuit 35, level shifter circuit 36, P-MOS transistor 37, N-MOS transistor 38, regulator circuit 39 and resistance element 40 in the second embodiment are the same as the common source line 21, level detection circuit 22, level shifter circuit 23, P-MOS transistor P1, erase pulse generation circuit 24, level shifter circuit 25, P-MOS transistor P2, N-MOS transistor N2, regulator circuit 27 and resistance element 28 in the first embodiment, respectively.

In the first embodiment, the voltage applied to the common source line 21 is the voltage Vpp (for example, 12 V) inputted from the external power source 26. In general, however, a nonvolatile semiconductor memory such as a flash memory has a single power source. Various voltages required for respective modes as shown in Table 1 are generated by an internal charge pump circuit for boosting a voltage.

In this embodiment, a voltage Hvpp boosted by a voltage boosting circuit (voltage boosting charge pump circuit in the nonvolatile semiconductor memory) 41 is used instead of the voltage Vpp from the external power source 26 used in the first embodiment. Thus, a more practical configuration of a nonvolatile semiconductor memory is achieved. Here, the voltage HVpp is about 10 V.

In this embodiment, the voltage HVpp is inputted to the regulator circuit 39 via the resistance element 40, and a stable voltage Vpll of 5 V is outputted from the regulator circuit 39. A maximum erase current including a leakage current that flows immediately after the first erase pulse application is 2 mA, which is the same as in the first embodiment. Therefore, when the resistance value of the resistance element 40 is {10 V–5 V}/2 mA=2500 Ω, the output from the regulator circuit 39 including the voltage during the flow of the maximum erase current can be maintained at the stable voltage Vpll of 5 V.

It is noted that, since the voltage HVpp from the voltage boosting circuit 41 is about 10 V, the level detection circuit 32 in this embodiment uses 9 V as a reference voltage (Ref voltage).

Figure 7:
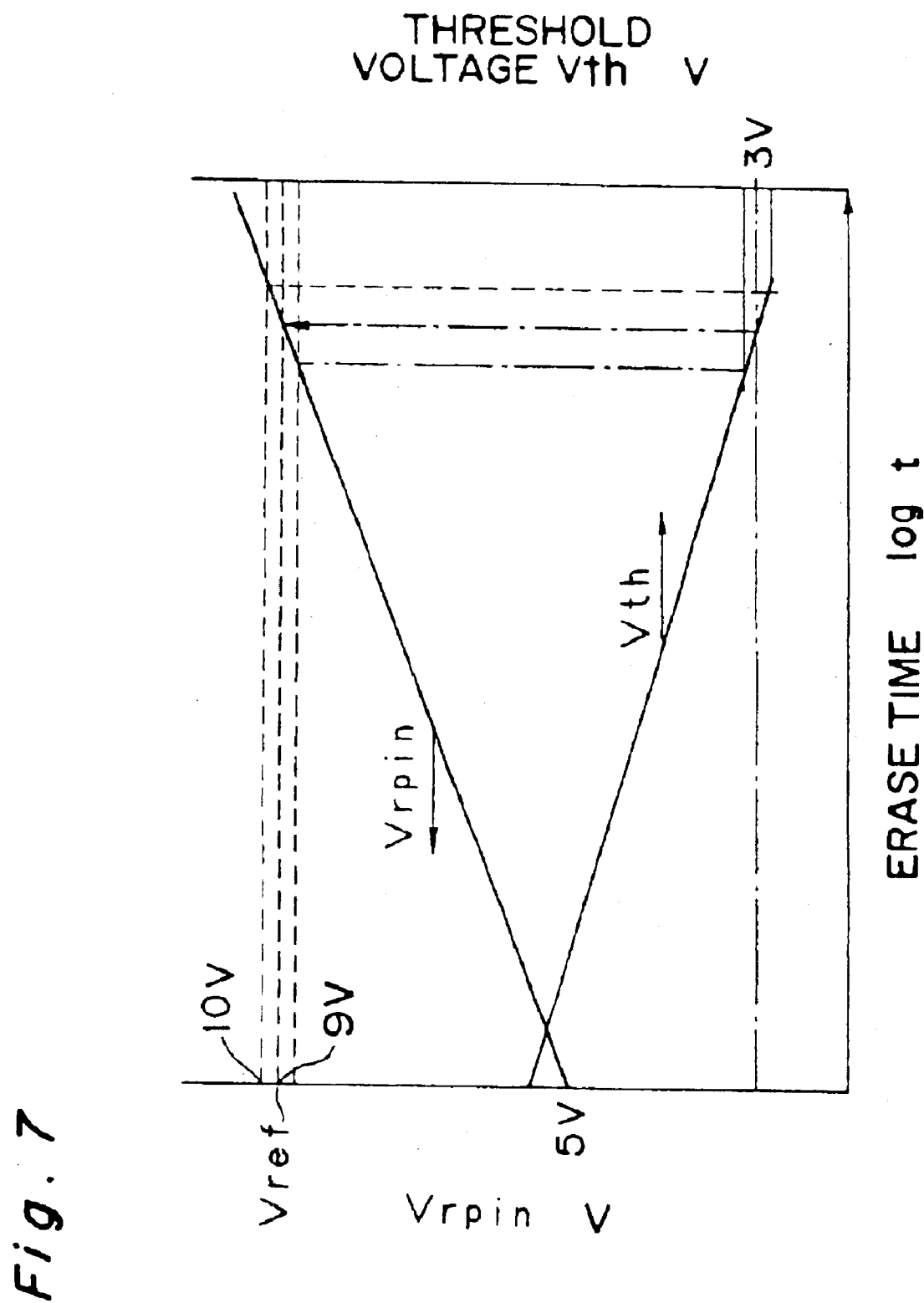
FIG. 7 shows changes in both an input voltage to the regulator circuit and a threshold voltage of a memory cell shown in FIG. 6 with respect to an erase time.
Figure 8:
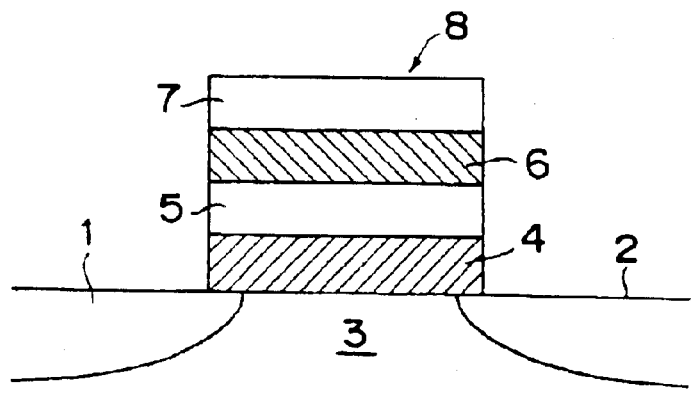
FIG. 8 is a schematic cross sectional view of a conventional ETOX-type flash memory cell.
Figure 9:
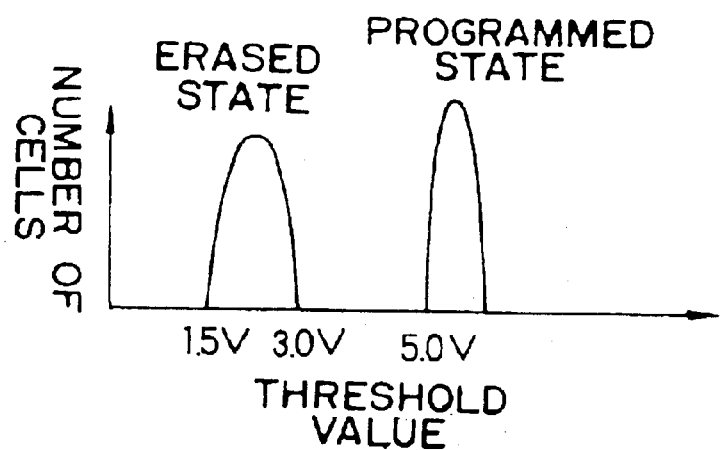
FIG. 9 shows threshold voltage distribution in a written state and an erased state.
Figure 10:
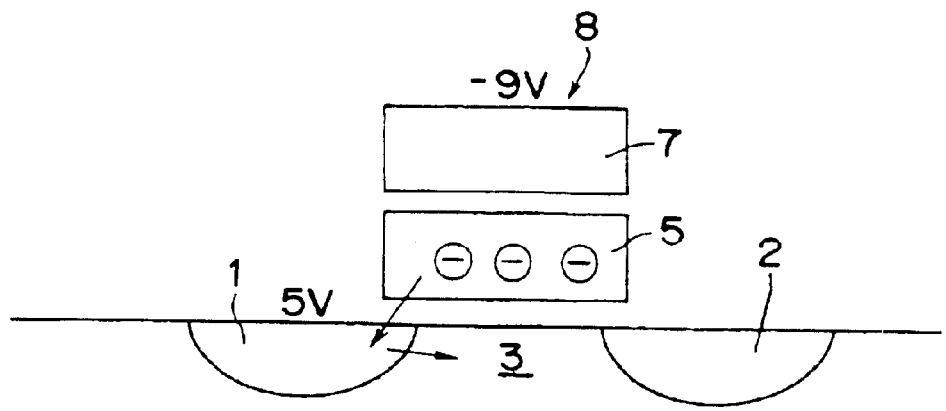
FIG. 10 is a view for explaining a negative voltage control gate erase method.
Figure 11:
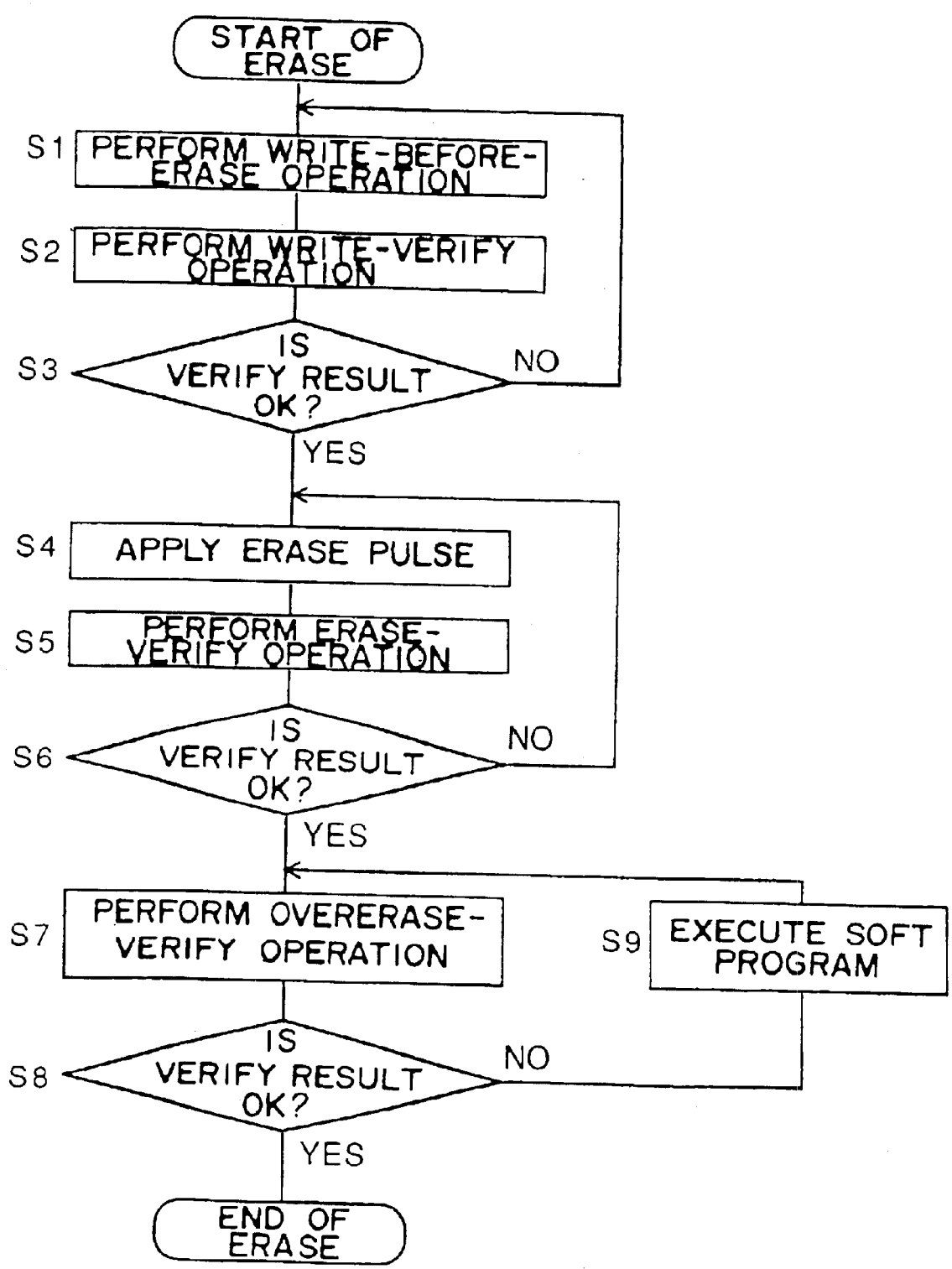
FIG. 11 shows an algorithm of a conventional erase operation.
Figure 12:
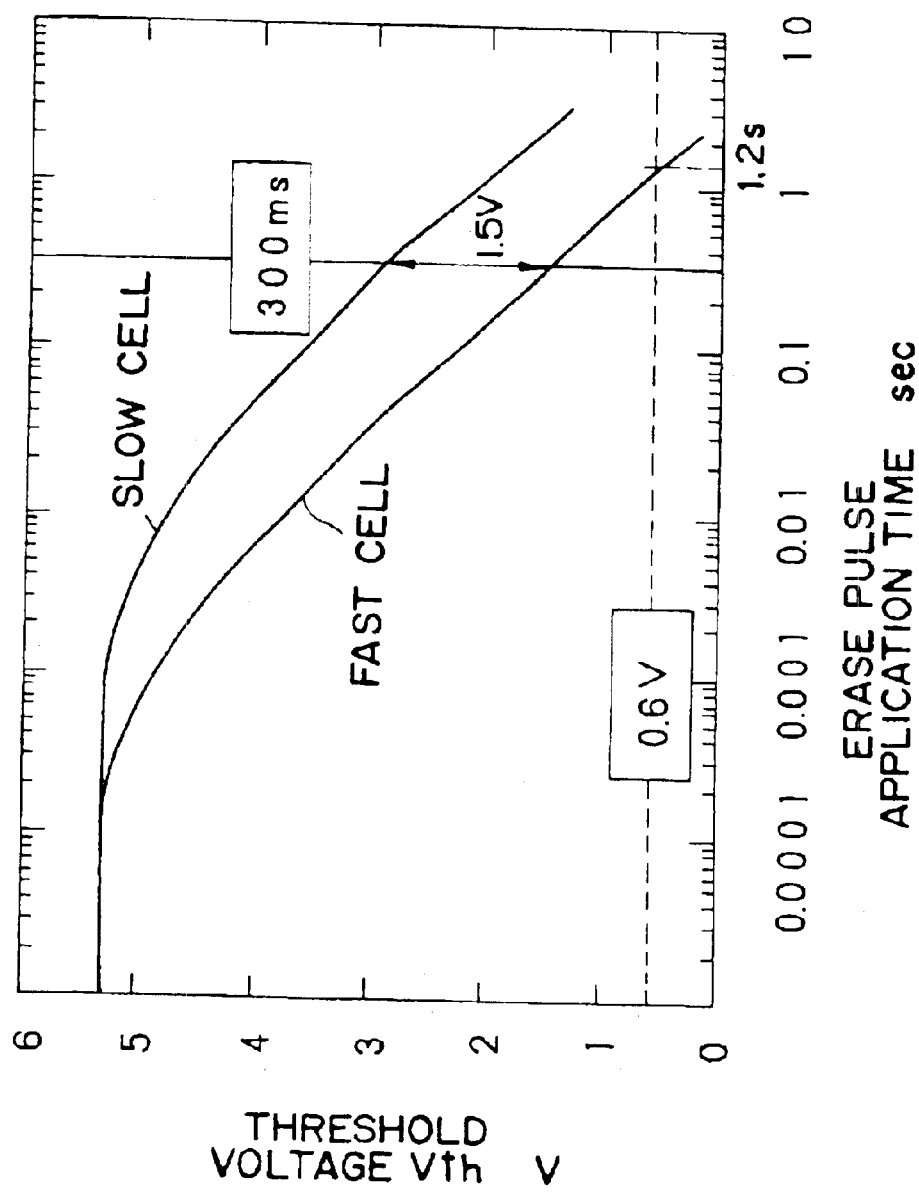
FIG. 12 shows erase characteristics of memory cells.

In this case, FIG. 7 shows the relationship between the input voltage Vrpin to the regulator circuit 39 and the erase time, and the relationship between the threshold voltage Vth of the memory cell and the erase time. Since the voltage Vrpin during erasure starts at an initial voltage of 5 V and a voltage magnitude of about 4 V or larger can be secured, an influence of the variation on the output stage can be made small even if the offset voltage variation is existent at the input stage of the level detection circuit 32 due to a process variation or a temperature variation. Therefore, as in the case of the first embodiment, the variation in the threshold voltage of the memory cell after the termination of the first erase pulse application can be made small and reduced to a range of about ±0.2 V, that is, about 0.4 V.

As a result, the same effect as in the first embodiment can be obtained. In this embodiment, since the voltage HVpp is internally generated by the voltage boosting circuit 41, the external power source 26 for capturing the voltage Vpp is not required unlike the first embodiment.

In the above embodiments, the difference between the initial voltage of the input voltage Vrpin of the regulator circuit 27, 39 and the reference voltage Vref of the level detection circuit 22, 32 is preferably set at 4 V or higher. Therefore, the voltage Vpp and the voltage HVpp are preferably set at 9 V or higher.

Figure 13:
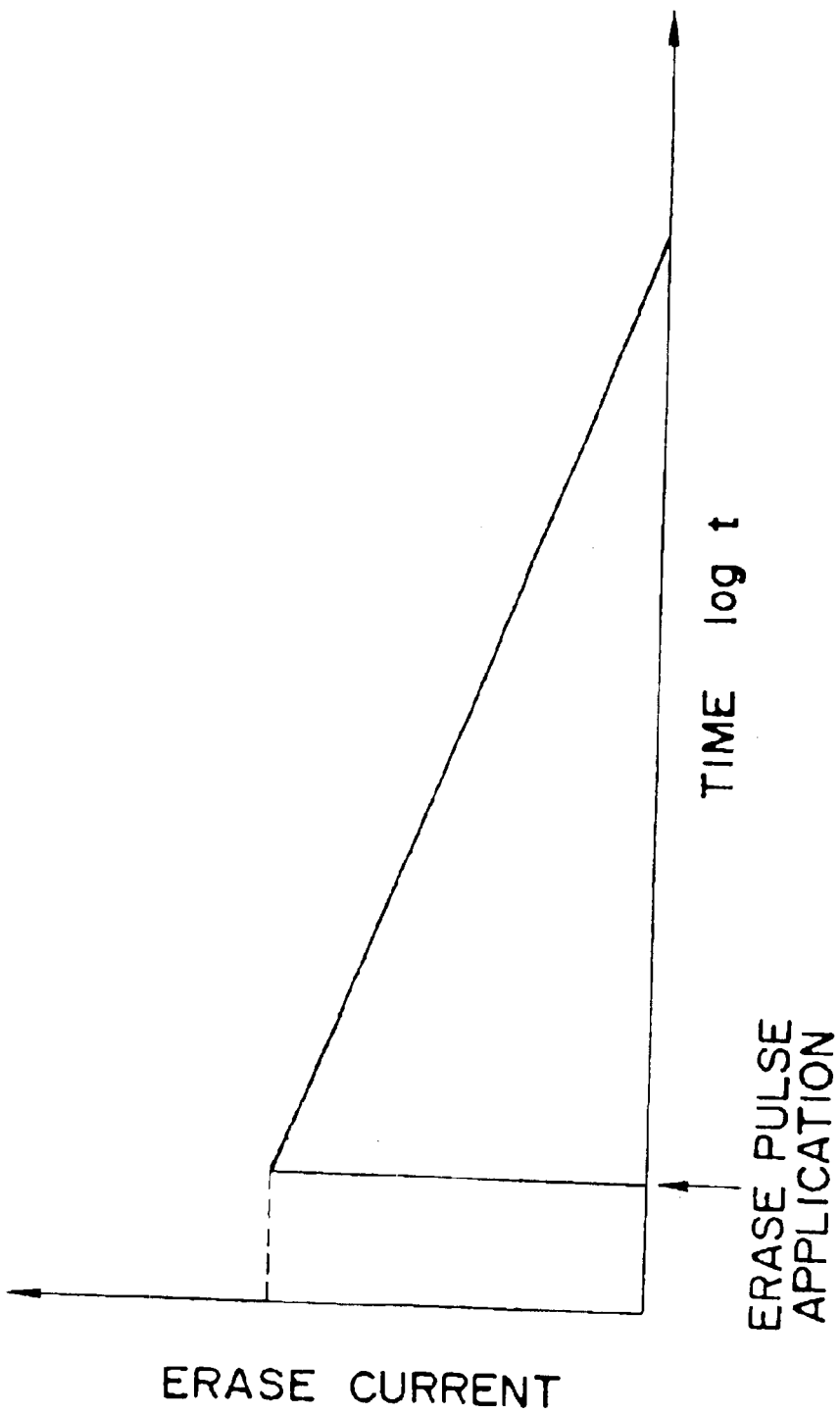
FIG. 13 shows the relationship between an erase current in a memory cell and an erase time.
Figure 14:
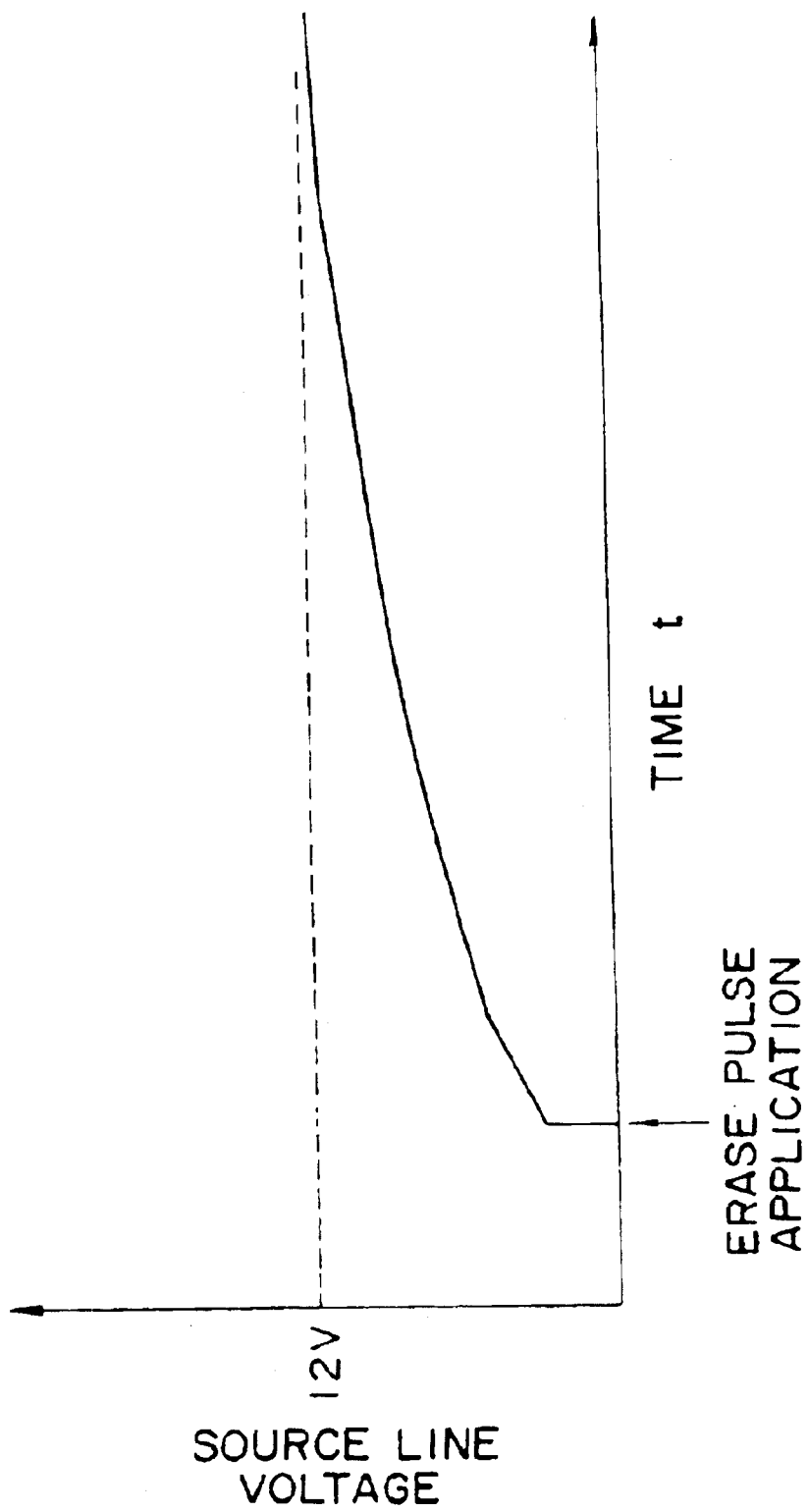
FIG. 14 shows the relation between a source line voltage in a memory cell and an erase time.
Figure 15:
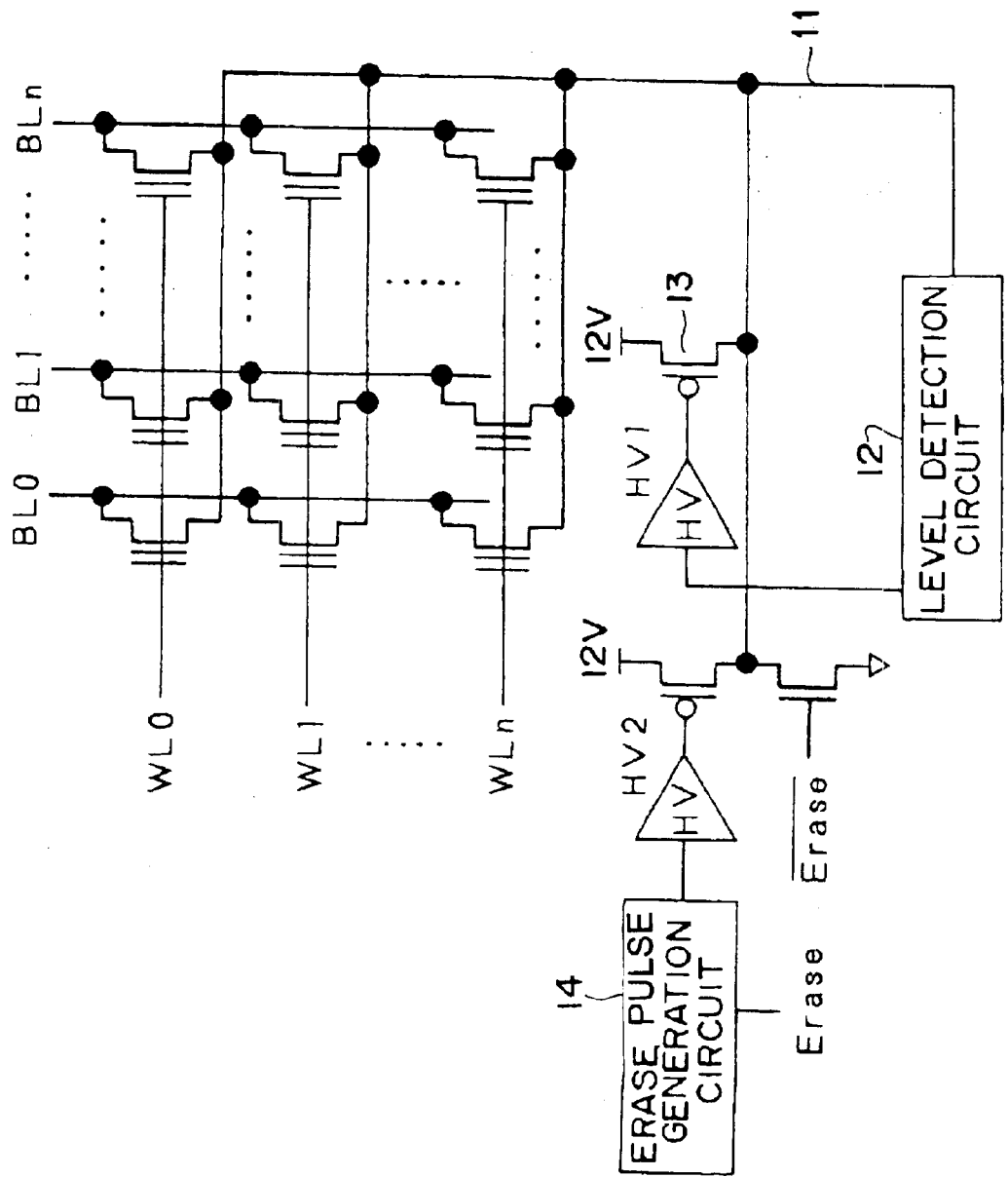
FIG. 15 is a block diagram of a source voltage application circuit during erasure in a conventional erase method 2.
Figure 16:
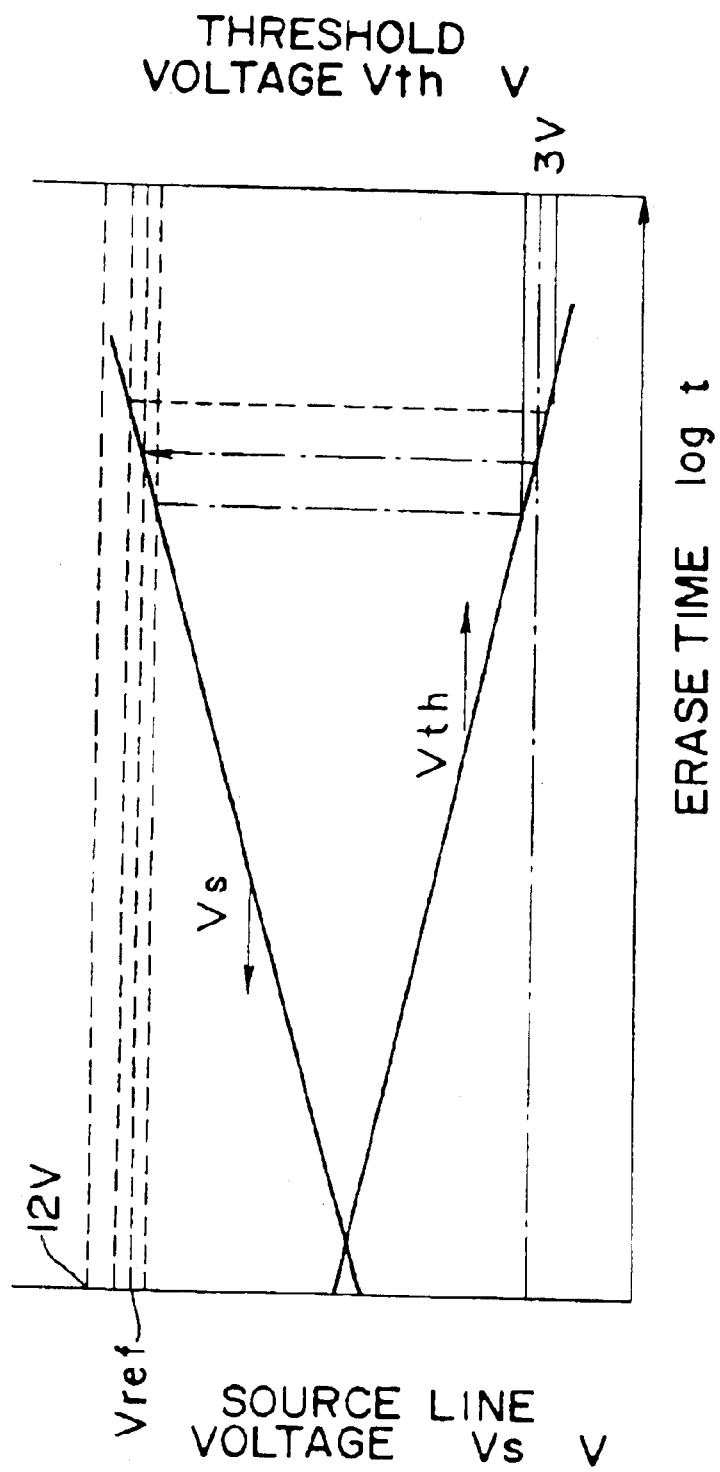
FIG. 16 shows changes in both an input voltage to the regulator circuit and a threshold voltage of a memory cell shown in FIG. 15 with respect to an erase time.
Figure 17:
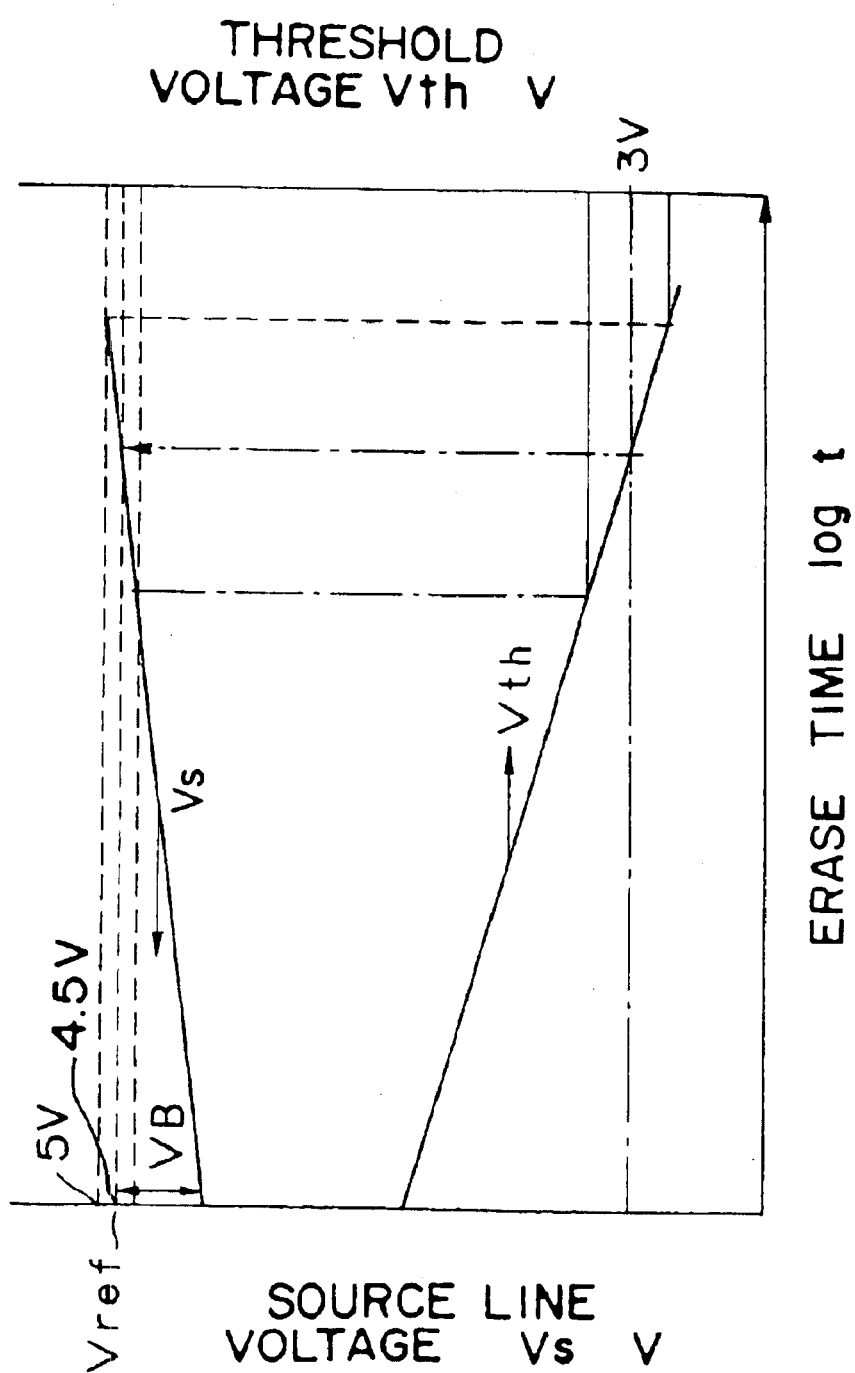
FIG. 17 shows the relationship between the threshold voltage and the source line voltage with respect to an erase time when the negative voltage control gate erase method is applied to the conventional erase method 2.

Furthermore, in the above embodiments, the termination of the first erase pulse application is judged based on an increase attributable to the decrease of the erase current value of the voltage value supplied from the external power source 26 or the voltage boosting circuit 41 to the regulator circuit 27, 39 via the resistance element 28, 40. However, this invention is not limited to this method. The decrease of the erase current value shown in FIG. 13 may be directly detected and the termination of the first erase pulse application may be judged based on this detection result.

The invention being thus described, it will be obvious that the invention may be varied in many ways. Such variations are not be regarded as a departure from the spirit and scope of the invention, and all such modifications as would be obvious to one skilled in the art are intended to be included within the scope of the following claims.

What is claimed is:

1. A nonvolatile semiconductor memory device, comprising:
   a plurality of floating gate field effect transistors each having a control gate, a floating gate, a drain and a source and capable of electrically writing and erasing data, the floating gate field effect transistors being arrayed in a matrix on a substrate or a well;
   a plurality of row lines each connected to control gates of the floating gate field effect transistors arrayed in a row direction;
   a plurality of column lines each connected to drains of the floating gate field effect transistors arrayed in a column direction;
   a common source line connected to sources of the floating gate field effect transistors constituting a block;
   a regulator circuit for supplying a voltage applied to the common source line at least during erasure;
   a resistance element inserted between the regulator circuit and an external power source;
   voltage level detecting means for instructing start of the erase voltage application to the common source line, detecting that an input voltage from the resistance element to the regulator circuit reaches a prescribed voltage level and instructing termination of the erase voltage application to the common source line; and
   erase voltage applying means for receiving an instruction from the voltage level detecting means and applying an erase voltage from the regulator circuit to the common source line.

2. The nonvolatile semiconductor memory device according to claim 1, further comprising:
   a voltage boosting circuit provided between the external power source and the resistance element, wherein
   an output voltage from the voltage boosting circuit is supplied to the regulator circuit via the resistance element.

3. The nonvolatile semiconductor memory device according to claim 1, wherein
   the prescribed voltage level detected by the voltage level detecting means is a voltage higher than the erase voltage applied to the common source line.

4. The nonvolatile semiconductor memory device according to claim 2, wherein
   the prescribed voltage level detected by the voltage level detecting means is a voltage higher than the erase voltage applied to the common source line.

5. The nonvolatile semiconductor memory device according to claim 1, wherein
   a resistance value of the resistance element is set at {a voltage of the external power source−the erase voltage}/{a maximum value of erase current}.

6. The nonvolatile semiconductor memory device according to claim 2, wherein
   a resistance value of the resistance element is set at {the output voltage of the voltage boosting circuit during erasure−the erase voltage}/{a maximum value of erase current}.

7. The nonvolatile semiconductor memory device according to claim 1, wherein
   an output voltage of the external power source during erasure is a voltage higher than the erase voltage.

8. The nonvolatile semiconductor memory device according to claim 2, wherein
   an output voltage of the voltage boosting circuit during erasure is a voltage higher than the erase voltage.

9. The nonvolatile semiconductor memory device according to claim 7, wherein
   the voltage of the external power source during erasure is 9 V or higher.

10. The nonvolatile semiconductor memory device according to claim 8, wherein
    the output voltage of the voltage boosting circuit during erasure is 9 V or higher.

11. A method of erasing a nonvolatile semiconductor memory device in which floating gate field effect transistors each having a control gate, floating gate, drain and source and capable of electrically writing and erasing data are arrayed in a matrix on a substrate or a well, a plurality of row lines connected to control gates floating gate field effect transistors arrayed in a row direction and a plurality of column lines connected to drains of floating gate field effect transistors arrayed in a column direction are included and sources of the floating gate field effect transistors constituting a block are connected to a common source line, the method comprising:
    a first erase operation for continuing to apply an erase voltage to the common source line; and
    a second erase operation for repeating erase pulse application to the common source line and an erase-verify operation alternately,
    wherein a current value flowing between a stabilization circuit for generating a voltage applied to the common source line and a power source of this stabilization circuit is detected during the first operation and when the current value reaches a prescribed current value, the first erase operation is stopped and the second erase operation is started.

12. The method of erasing a nonvolatile semiconductor memory device according to claim 11, wherein
    the power source of the stabilization circuit is an internal voltage boosting circuit.

* * * * *